United States Patent
Papadopoulos et al.

(10) Patent No.: US 8,279,954 B2
(45) Date of Patent: Oct. 2, 2012

(54) ADAPTIVE FORWARD-BACKWARD SOFT OUTPUT M-ALGORITHM RECEIVER STRUCTURES

(75) Inventors: Haralabos Papadopoulos, San Jose, CA (US); Carl-Erik W. Sundberg, Sunnyvale, CA (US)

(73) Assignee: NTT DoCoMo, Inc., Tokyo (JP)

( * ) Notice: Subject to any disclaimer, the term of this patent is extended or adjusted under 35 U.S.C. 154(b) by 671 days.

(21) Appl. No.: 12/335,409

(22) Filed: Dec. 15, 2008

(65) Prior Publication Data
US 2009/0225878 A1    Sep. 10, 2009

Related U.S. Application Data

(60) Provisional application No. 61/034,409, filed on Mar. 6, 2008.

(51) Int. Cl.
*H04K 1/10* (2006.01)
(52) U.S. Cl. ........ 375/260; 375/144; 375/148; 375/150; 375/227; 375/232; 375/262; 375/267; 375/324; 375/346
(58) Field of Classification Search .................. 375/260, 375/267, 144, 148, 150, 227, 232, 262, 324, 375/346; 714/755, 794, 796
See application file for complete search history.

(56) References Cited

U.S. PATENT DOCUMENTS

| | | |
|---|---|---|
| 5,903,842 A | 5/1999 | Wang et al. |
| 5,982,327 A | 11/1999 | Vook et al. |
| 6,629,287 B1 | 9/2003 | Brink |
| 6,804,307 B1 | 10/2004 | Popovic |
| 6,862,552 B2 | 3/2005 | Goldstein et al. |
| 6,901,117 B1 * | 5/2005 | Classon et al. ............... 375/341 |
| 7,042,858 B1 | 5/2006 | Ma et al. |
| 7,072,295 B1 | 7/2006 | Benson et al. |
| 7,095,812 B2 | 8/2006 | Chan |

(Continued)

FOREIGN PATENT DOCUMENTS

EP    1162750 A2    12/2001

(Continued)

OTHER PUBLICATIONS

Kitty Wong and Peter McLane, "Low complexity Space time Turbo Equalizer with the soft output M-algorithm for Frequnecy selective channels" 2005 IEEE.*

(Continued)

*Primary Examiner* — Dhaval Patel
(74) *Attorney, Agent, or Firm* — Blakely, Sokoloff, Taylor & Zafman LLP

(57) ABSTRACT

A method and apparatus is disclosed herein for forward-backward SOMA techniques. In one embodiment, the apparatus is a receiver comprising: an inner decoder structure having a soft output M-algorithm (SOMA) based multiple-in multiple-out (MIMO) joint demapper that uses a SOMA-based MIMO detection process to perform joint inner demapping over each tone, where the SOMA-based MIMO joint demapper is operable to identify a best candidate among a number of candidates by searching a detection tree for each tone using a forward pass through the detection tree, where only a number of best alternatives from every level of the tree are expanded and where soft-output related information is collected and stored, and to perform a second pass, following the forward pass, during which soft-output is computed for each bit; and an outer decoder operable with the SOMA-based inner decoder to perform iterative decoding.

23 Claims, 14 Drawing Sheets

U.S. PATENT DOCUMENTS

| | | | |
|---|---|---|---|
| 7,251,768 | B2 | 7/2007 | Giannakis et al. |
| 7,308,047 | B2 | 12/2007 | Sadowsky |
| 7,310,369 | B1 * | 12/2007 | Krieger et al. ............... 375/227 |
| 7,436,895 | B1 | 10/2008 | Tujkovic |
| 7,441,045 | B2 | 10/2008 | Skene et al. |
| 7,443,925 | B2 | 10/2008 | Mehta et al. |
| 7,564,915 | B2 | 7/2009 | Lee et al. |
| 7,620,117 | B2 | 11/2009 | Chae et al. |
| 7,877,097 | B2 | 1/2011 | Zhu et al. |
| 7,877,108 | B2 | 1/2011 | Wengerter et al. |
| 8,042,031 | B2 | 10/2011 | Chen et al. |
| 2002/0114404 | A1 | 8/2002 | Aizawa et al. |
| 2002/0176431 | A1 | 11/2002 | Golla et al. |
| 2003/0236080 | A1 | 12/2003 | Kadous et al. |
| 2004/0022179 | A1 | 2/2004 | Giannakis et al. |
| 2004/0116146 | A1 | 6/2004 | Sadowsky et al. |
| 2004/0165675 | A1 * | 8/2004 | Ito et al. ...................... 375/267 |
| 2004/0205445 | A1 | 10/2004 | Xu |
| 2005/0010675 | A1 | 1/2005 | Jaggi et al. |
| 2005/0041751 | A1 | 2/2005 | Nir et al. |
| 2005/0047514 | A1 | 3/2005 | Bolinth et al. |
| 2005/0068918 | A1 | 3/2005 | Mantravadi et al. |
| 2005/0111592 | A1 | 5/2005 | Yee |
| 2005/0152391 | A1 | 7/2005 | Effros et al. |
| 2005/0185707 | A1 | 8/2005 | Hoo et al. |
| 2005/0265280 | A1 | 12/2005 | Roh et al. |
| 2006/0002312 | A1 | 1/2006 | Delattre et al. |
| 2006/0020560 | A1 | 1/2006 | Rodriguez et al. |
| 2006/0029124 | A1 | 2/2006 | Grant et al. |
| 2006/0098760 | A1 | 5/2006 | Shen et al. |
| 2006/0146716 | A1 | 7/2006 | Lun et al. |
| 2006/0146791 | A1 | 7/2006 | Deb et al. |
| 2006/0148506 | A1 | 7/2006 | Hoo |
| 2006/0176945 | A1 | 8/2006 | Li |
| 2007/0041475 | A1 * | 2/2007 | Koshy et al. .................. 375/340 |
| 2007/0066229 | A1 | 3/2007 | Zhang et al. |
| 2007/0198899 | A1 | 8/2007 | Yellin et al. |
| 2007/0281633 | A1 | 12/2007 | Papadopoulos |
| 2007/0286313 | A1 * | 12/2007 | Nikopour-Deilami et al. ............................ 375/341 |
| 2008/0025430 | A1 | 1/2008 | Sadowsky |
| 2008/0032630 | A1 | 2/2008 | Kim et al. |
| 2008/0075022 | A1 | 3/2008 | Lei et al. |
| 2008/0092028 | A1 | 4/2008 | Orio |
| 2008/0101310 | A1 | 5/2008 | Marzetta |
| 2008/0123781 | A1 | 5/2008 | Pisek et al. |
| 2008/0181339 | A1 | 7/2008 | Chen et al. |
| 2008/0212526 | A1 | 9/2008 | Oyman |
| 2009/0082054 | A1 | 3/2009 | Li et al. |
| 2009/0213954 | A1 * | 8/2009 | Bursalioglu et al. .......... 375/262 |
| 2009/0225878 | A1 | 9/2009 | Papadopoulos et al. |
| 2009/0285323 | A1 * | 11/2009 | Sundberg et al. ............. 375/267 |
| 2009/0291699 | A1 | 11/2009 | Heath et al. |
| 2009/0296842 | A1 * | 12/2009 | Papadopoulos et al. ....... 375/260 |

FOREIGN PATENT DOCUMENTS

| | | |
|---|---|---|
| EP | 1383246 A2 | 1/2004 |
| EP | 1411693 A2 | 4/2004 |
| EP | 1521386 A2 | 4/2005 |
| EP | 1530387 A1 | 5/2005 |
| EP | 1648097 A | 4/2006 |
| EP | 1648097 A2 | 4/2006 |
| EP | 1827040 A1 | 8/2007 |
| EP | 1863208 A1 | 12/2007 |
| GB | 2304495 | 3/1997 |
| GB | 2407007 A | 4/2005 |
| KR | 1020060063478 A | 6/2006 |
| WO | WO 01/43293 A1 | 6/2001 |
| WO | WO 2004/045167 A | 5/2004 |
| WO | WO 2004/025011 A | 7/2004 |
| WO | WO 2004/056011 A1 | 7/2004 |
| WO | WO 2005/046081 A1 | 5/2005 |
| WO | WO 2006/029050 A | 3/2006 |
| WO | WO 2007/050860 A1 | 5/2007 |
| WO | WO 2007/073267 A1 | 6/2007 |
| WO | WO 2007/087540 A2 | 8/2007 |
| WO | WO 2007/129990 A1 | 11/2007 |
| WO | WO 2008/057791 A1 | 5/2008 |
| WO | WO 2008/143973 A1 | 11/2008 |
| WO | WO 2009/033023 A2 | 3/2009 |
| WO | WO 2010/019618 A2 | 2/2010 |

OTHER PUBLICATIONS

Kitty Wong and Peter McLane, "Bi-directional Soft-output M-algorithm for Iterative decoding", 2004 IEEE, IEEE communication society.*

PCT International Search Report dated Sep. 18, 2008, for PCT/US08/006286, filed May 16, 2008, 4 pages.

Written Opinion of the International Searching Authority dated Sep. 18, 2008, for PCT/US08/006286, filed May 16, 2008, 8 pages.

International Search Report mailed Nov. 6, 2008 for PCT/US08/065675, filed Jun. 3, 2008, 5 pages.

Written Opinion of the International Searching Authority mailed Nov. 6, 2008 for PCT/US08/065675, filed Jun. 3, 2008, 8 pages.

International Search Report for related application WO 08/048651, dated Jun. 25, 2008.

Written Opinion of the International Searching Authority for related application WO 08/048651, dated Jun. 25, 2008.

Communication Relating to the Results of the Partial International Search dated Jan. 31, 2009 for PCT/US07/13074, filed Jun. 1, 2007.

PCT International Search Report dated Apr. 14, 2008 for PCT/US07/23207, 3 pages.

Written Opinion of the International Searching Authority dated Apr. 14, 2008 for PCT/US07/23207, 6 pages.

International Search Report dated Apr. 15, 2008 for PCT/US07/24572, 4 pages.

Written Opinion of the International Searching Authority dated Apr. 15, 2008 for PCT/US07/24572, 6 pages.

PCT International Search Report dated Aug. 20, 2008 for PCT/US08/03274, 4 pages.

Written Opinion of the International Searching Authority dated Aug. 20, 2008 for PCT/US08/03274, 10 pages.

Lattice Semiconductor Corp., "Turbo Decoder", IP Data Sheet, 2003, 6 pages.

Kao, Chien-Yu, "A Bi-directional SOVA with Normalization for Turbo Decoding", Jun. 2006, Tainan, Taiwan, 72 pages.

Cox, Richard V., et al., "Subband Speech Coding and Matched Convolutional Channel Coding for Mobile Radio Channels", IEEE Transactions on Signal Processing, vol. 39, No. 8, Aug. 1991, pp. 1717-1731.

Hagenauer, Joachim, et al., "The Performance of Rate-Compatible Punctured Convolutional Codes for Digital Mobile Radio", IEEE Transactions on Communications, vol. 38, No. 7, Jul. 1990, pp. 966-980.

Lee, Inkyu, et al., "Code Design of Space-Time Bit-Interleaved Coded Modulation Systems for Maximum Diversity", ICC, Jun. 2004, 11 pages.

Taddei, Herve, et al., Mode Adaptive Unequal Error Protection for Transform Predictive Speech and Audio Coders, IEEE, 2002, pp. 165-168.

Kawai, H., et al., "Independent adaptive control of surviving symbol replica candidates at each stage based on minimum branch metric in QRM-MLD for OFCDM MIMO multiplexing", IEEE Vehicular Techonology Conference, VTC2004, vol. 3, Sep. 2004, pp. 1558-1564.

Wong, K.K.Y., et al., "Low-complexity space-time turbo equalizer with the soft-output M-algorithm for frequency-selective channels", IEEE International Conference on Communications, vol. 4, May 2005, pp. 2251-2255.

Wong, K.K.Y., et al., "Bi-directional soft-output m-algorithm for iterative decoding", IEEE International Conference on Communications, vol. 2, Jun. 2004, pp. 792-797.

Kitty, K.Y. Wong, et al., "Soft-Output Trellis/Tree Iterative Decoder for high-order BICM on MIMO Frequency Selective Rayleigh Fading Channels", IEEE International Conference on Communications, Jun. 2006, pp. 4278-4284.

Papadopoulos, H., et al., "Wideband space-time coded systems with non-collocated antennas", Radio and Wireless Symposium, 2008 IEEE, Jan. 22, 2008, pp. 307-310.

Lee, Inkyu, et al., "Diversity Analysis for Space-Time, Bit-Interleaved Coded Modulation Systems", Korea University, Seoul, Korea, Jan. 2007.

Gencata, et al., "Virtual-topology adaptation for WDM mesh networks under dynamic traffic," Proceedings of IEEE Infocom 2002, vol. 1, Jun. 23, 2002, pp. 48-56.

Koetter, R., et al., "Beyond routing: an algebraic approach to network coding," Proceedings of IEEE Infocom 2002, vol. 1, Jun. 23, 2002, pp. 122-130.

Del Re, Enrico, et al., "Next-Generation Mobile Satellite Networks," IEEE Communications Magazine, vol. 40, No. 9, Sep. 1, 2002, pp. 150-159.

Ernest, P.H.H., et al., "An efficient algorithm for virtual topology reconfiguration in WDM optical ring networks," Proceedings of 10th Conference on Computer Communications and Networks, Oct. 15, 2001, pp. 55-60.

Fasolo, E., "Network coding techniques," www.cs.virginia.edu/{yw5s/Network%20coding.ppt, Mar. 7, 2004, pp. 1-14.

Chou, P.A., et al., "Network Coding for the Internet and Wireless Networks", www.eecs.umich.edu/systems/ChouSeminar.ppt, Mar. 28, 2006, pp. 1-29.

Ahlswede, R., et al., "Network Information Flow", IEEE Transactions on Information Theory, IT-46(4), Jul. 2000, pp. 1204-1216.

Ho, T., et al., "The Benefits of Coding Over Routing in a Randomized Setting", in the Proceedings of the International Symposium on Information Theory (ISIT), Jun. 2003, pp. 1-6.

Katti, S., et al., "XORs in the Air: Practical Wireless Network Coding", in the Proceedings of the ACM Special Interest Group on Data Communication (SIGCOMM), Sep. 2006, 12 pages.

Koetter, R., et al., "An Algebraic Approach to Network Coding", IEEE/ACM Transactions on Networking, vol. 11, No. 5, Oct. 2003, pp. 782-795.

Li, S. R., et al., "Linear Network Coding", IEEE Transactions on Information Theory, IT-49(2), Feb. 2003, pp. 371-381.

Chou, P.A., et al., "Practical Network Coding", 51st Allerton Conference on Communication, Control and Computing, Oct. 2003, 10 pages.

Cormen, T.H., et al., "Introduction to Algorithms", 2nd Edition, MIT Press and McGraw-Hill, 2001, pp. 643-700.

Jafarkani, H., "Space-Time Coding, Theory and Practice", Cambridge University Press, 2005.

Yiu, S., et al., "Distributed Block Source Coding", IEEE GLOBECOM 2005 Proceedings, Nov. 2005.

Su, W., et al., "Signal Constellations for Quasi-Orthogonal Space-Time Block Codes with Full Diversity", IEEE Transactions on Information Theory, Oct. 2004, pp. 2231-2347.

Jafarkani, H., "A Quasi-Orthogonal Space-Time Block Code", IEEE Transactions on Communications, Jan. 2001, 4 pages.

Tirkkonen, O. et al.: "Minimal Non-Orthogonality Rate 1 Space-Time Block Code for 3+ Transmit Antennas," IEEE 6th Int. Symp. Spread Spectrum Tech. and Appl., pp. 429-432, Sep. 2000, 4 pages.

Sharma, N. et al.: "Improved Quasi-Orthogonal Codes Through Constellation Rotation," IEEE Trans. Communications, pp. 332-335, Mar. 2003, 3 pages.

Wang, H. et al.: "Upper Bounds of Rates of Space-Time Block Codes from Complex Orthogonal Designs," IEEE Trans. Information Theory, pp. 2788-2796, Oct. 2003, 9 pages.

El Gamal, H. et al., "Distributed Space-Time Filtering for Cooperative Wireless Networks", GLOBECOM'03, Dec. 2003, pp. 1826-1830.

Sezgin, A., et al., "On EXIT-Chart Analysis of Coherent and Non-Coherent Space-Time Codes", Smart Antennas, 2004, pp. 49-56.

Horn, R.A., et al., "Matrix Analysis", Cambridge University Press, New York, 1994.

Tse, D., et al., "Fundamentals of Wireless Communication", Cambridge University Press, May 2005.

Stott, J.H., "The DVB Terrestrial (DVB-T) Specification and Its Implementation in a Practical Modem", Proceedings of the 1996 International Broadcasting Convention, IEEE Conference Publication No. 428, Sep. 1996, pp. 255-260.

Guerin, R., et al., "Quality-of-Service in Packet Networks: Basic Mechanisms and Directions", Invited Paper, Computer Networks, vol. 31, No. 3, Feb. 1999, pp. 1-16.

Zhang, H., "Service Disciplines for Guaranteed Performance Service in Packet-Switching Networks", in the Proceedings of the IEEE, vol. 83, No. 10, Oct. 1995, pp. 1-23.

Caire, G., et al., "Achievable Throughput of MIMO Downlink Beamforming and Limited Channel Information", Proceedings of IEEE PIMRC, Aug. 2007.

Medard, M., "The Effect upon Channel Capacity in Wireless Communication of Imperfect Knowledge of the Channel", IEEE Transactions on Information Theory, May 2000, pp. 935-945.

Marzetta, T.L., "How Much Training Is Required for Multi-User MIMO?", ACSSC96, Asilomar Conference Oct. 2006.

Wiswanath, P., et al., "Sum Capacity of the Multiple Antenna Gaussian Broadcast Channel and Uplink-Downlink Duality", IEEE Transactions on Information Theory, Aug. 2003, pp. 1912-1923.

Peel, C.B., et al., "A Vector Pertrubation Technique for Near-Capacity Multi Antenna Multi User Communication, Part I. Channel Inversion and Regularization", IEEE Transactions on Communications, Jan. 2005, pp. 195-202.

Joham, M., et al., "Linear Transmit Processing in MIMO Communications Systems", IEEE Transactions on Signal Processing, Aug. 2005, pp. 2700-2712.

US Office Action for U.S. Appl. No. 11/873,248, dated Mar. 31, 2010, 18 pages.

Korean Office Action for corresponding Korean Patent Application No. 2008-7025915, dated Feb. 9, 2010.

PCT International Preliminary Report on Patentability for PCT Patent Application No. PCT/US2008/076252, dated Apr. 1, 2010, 9 pages.

PCT International Preliminary Report on Patentability for PCT Patent Application No. PCT/US2008/073646, dated Mar. 4, 2010, 6 pages.

Su, W., et al., "Two Generalized Complex Orthogonal Space-Time Block Codes of Rates 7/11 and 3/5 for 5 and 6 Transmit Antennas", IEEE Transactions on Information Theory, Jan. 2003, vol. 49, No. 1, pp. 313-316.

International Search Report dated Apr. 17, 2009 for PCT/US2008/076252, 5 pages.

Written Opinion of the International Searching Authority dated Apr. 17, 2008 for PCT/US2008/076252, 9 pages.

Osseiran, A., The Winner II Air Interface: Refined Spatial-Temporal Processing Solutions, Online Citation <https://www.ist.-winner.org/WINNER2-Deliverables/D3.4.1.pdf>, Jan. 1, 2007, pp. 1-148.

Bandemer, B., et al., "Linear MMSE Multi-User MIMO Downlink Precoding for Users with Multiple Antennas", IEEE International Symposium on Personal, Indoor and Mobile Communications, Sep. 1, 2006, pp. 1-5.

CATT, "Non-codebook based pre-coding for E-UTRA TDD Downlink", 3rd Generation Partnership Project, Oct. 4, 2006, pp. 1-3.

Gomadam, K.S., et al., "Techniques for Multi-user MIMO with Two-way Training", IEEE International Conference on Communications, May 19, 2008, pp. 3360-3366.

Written Opinion of the International Searching Authority dated Apr. 30, 2009 for PCT/US2007/022189, 8 pages.

US Office Action for U.S. Appl. No. 12/209,110 dated Feb. 11, 2011, 20 pages.

US Office Action for U.S. Appl. No. 12/121,649, Apr. 19, 2011, 25 pgs.

US Office Action for U.S. Appl. No. 12/130,821, Feb. 22, 2011, 12 pgs.

US Office Action for U.S. Appl. No. 12/121,634, Mar. 1, 2011, 19 pgs.

US Office Action for U.S. Appl. No. 11/644,638, Apr. 15, 2011, 7 pgs.

European Office Action for European Patent Application No. 09718026.9, Feb. 10, 2011, 3 pgs.

European Office Action for European Patent Application No. 08756664.2, Mar. 17, 2011, 6 pgs.

US Final Office Action for U.S. Appl. No. 11/644,638, dated Apr. 29, 2010, 22 pages.

Korean Office Action for corresponding Korean Patent Application No. 2008-7023249, dated May 27, 2010, 4 Pgs.

European Office Action for corresponding European Patent Application No. 07862325.3, dated Jul. 6, 2010, 6 pgs.

PCT International Search Report for PCT Patent Application No. PCT/US2009/053472, dated Jun. 14, 2010, 7 pgs.
Written Opinion of the International Searching Authority for PCT Patent Application No. PCT/US2009/053472, dated Jun. 14, 2010, 5 pgs.
US Final Office Action for U.S. Appl. No. 12/040,653, dated Jun. 15, 2010, 40 pages.
Michalke, Clemens, et al., "Linear Momo Receivers Vs. Tree Search Detection: A Performance Comparison Overview", IEEE Internatinal Symposium on Personal, Indoor and Mobile Radio Communications, Sep. 11, 2006, pp. 1-7.
Narayanan, K.R., et al., "Low Complexity Turbo Equalization with Binary Coding", IEEE International Conference on Communications, ICC '2000, New Orleans, pp. 1-5, vol. 1.
Hoeher, Peter, "Advances in Soft-Output Decoding", IEEE Global Telecommunications Conference, Nov.-Dec. 1993, pp. 793-797.
PCT International Search Report for PCT Patent Application No. PCT/US2009/035735, dated Jul. 13, 2009, 5 pages.
Written Opinion of the International Searching Authority for PCT Patent Application No. PCT/US2009/035735, dated Jul. 13, 2009, 8 pages.
US Office Action for U.S. Appl. No. 11/644,638, dated Sep. 30, 2010, 24 pages.
Korean Office Action for corresponding Korean Patent Application No. 2008-7025123, dated Sep. 29, 2010, 3 Pgs.
PCT International Preliminary Report on Patentability for PCT Patent Application No. PCT/US2009/035735, dated Sep. 16, 2010, 8 pages.
European Office Action for corresponding European Patent Application No. 07861675.2, dated Jul. 26, 2010, 4 pgs.
US Office Action for U.S. Appl. No. 11/754,903, dated Sep. 20, 2010, 18 pages.
US Office Action for U.S. Appl. No. 11/939,353, dated Sep. 22, 2010, 15 pages.
US Office Action for U.S. Appl. No. 11/644,638, dated Sep. 22, 2009, 13 pages.
PCT International Preliminary Report on Patentability for PCT Patent Application No. PCT/US2007/013074, dated Dec. 30, 2009, 8 pages.
PCT International Search Report for PCT Patent Application No. PCT/US2008/006287, dated Oct. 2, 2008, 6 pgs.
Written Opinion of the International Searching Authority for PCT Patent Application No. PCT/US2008/006287, dated Oct. 2, 2008, 7 pgs.
PCT International Preliminary Report on Patentability for PCT Patent Application No. PCT/US2008/065675, dated Dec. 17, 2009, 8 pages.
PCT International Search Report for PCT Patent Application No. PCT/US2009/054937, dated Dec. 30, 2009, 7 pgs.
Written Opinion of the International Searching Authority for PCT Patent Application No. PCT/US2009/054937, dated Dec. 30, 2009, 7 pgs.
Robertson, Patrick, et al., "A Comparison of Optimal and Sub-Optimal MAP Decoding Algorithms Operating in the Log Domain", Proceedings of the International Conference on Communications, Jun. 18, 1995, pp. 1009-1013, vol. 2, IEEE, New York, USA.
PCT International Search Report for PCT Patent Application No. PCT/US2009/56865, dated Mar. 2, 2010, 7 pgs.
Written Opinion of the International Searching Authority for PCT Patent Application No. PCT/US2009/56865, dated Mar. 2, 2010, 12 pgs.
PCT International Search Report for PCT Patent Application No. PCT/US2009/034758, dated Feb. 4, 2010, 7 pgs.
Written Opinion of the International Searching Authority for PCT Patent Application No. PCT/US2009/034758, dated Feb. 4, 2010, 7 pgs.
Sun, Sumei, et al., "Pseudo-Inverse MMSE Based QRD-M Algorithm for MIMO OFDM", Jan. 1, 2006, pp. 1545-1549, vol. 3.
Dai, Yongmei, et al., "A Comparative Study of QRD-M Detection and Sphere Decoding for MIMI-OFDM Systems", 2005 IEEE 16th International Symposium on Personal, Indoor and Mobile Radio Communications, Jan. 1, 2005, pp. 186-190.

US Final Office Action for U.S. Appl. No. 11/873,248, dated Sep. 1, 2010, 21 pages.
US Office Action for U.S. Appl. No. 11/939,353 dated Jan. 31, 2011, 15 pages.
Sen, et al., "Cute and jCUTE Concolic Unit Testing and Explicit Path Model-Checking Tool", Computer Aided Verification Lecture Notes in Computer Science, Jan. 1, 2006, pp. 419-423.
Majumdar, et al., "Hybrid Concolic Testing", IEEE 29th International Conference on Software Engineering, May 1, 2007, pp. 416-426.
PCT International Preliminary Report on Patentability for PCT Patent Application No. PCT/US2009/046014, dated Dec. 16, 2010, 9 pages.
PCT International Search Report for PCT Patent Application No. PCT/US2010/033549, Jan. 5, 2011, 5 pgs.
PCT Written Opinion of the International Searching Authority for PCT Patent Application No. PCT/US2010/033549, Jan. 5, 2011, 6 pgs.
European Office Action for European Patent Application No. 08767750.6, dated Jan. 12, 2011, 6 pgs.
PCT International Search Report for PCT Patent Application No. PCT/US2010/027139, Dec. 6, 2010, 5 pgs.
PCT Written Opinion of the International Searching Authority for PCT Patent Application No. PCT/US2010/027139, Dec. 6, 2011, 6 pgs.
European Office Action for European Patent Application No. 08767751.4, Jan. 14, 2011, 5 pgs.
Alamouti, S., "A Simple Transmit Diversity Technique for Wireless Communications", IEEE Journal on Select Areas in Communications, vol. 16, No. 8, Oct. 1998, pp. 1451-1458.
Chindapol, A., et al., "Design, Analysis, and Performance Evaluation for BICM-ID with Square QAM Constellations in Rayleigh Fading Channels", IEEE Journal on Selected Areas in Communications, vol. 19, No. 5, May 2001, pp. 944-957.
Higuchi, K., et al., "Adaptive Selection of Surviving Symbol Replica Candidates ased on Maximum Reliability in QRM_MLD for OFCDM MIMO Multiplexing", in Proc. Globecom, Dec. 2004, pp. 2480-2486.
Wong, K., "The Soft-Output M-Algorithm and Its Applications", PhD Thesis, Queens University, Kingston, Canada, Aug. 2006, 263 pages.
Lee, I., et al., "Space-Time Bit-Interleaved Coded Modulation for OFDM Systems", IEEE Transactions on Signal Processing, vol. 52, No. 3, Mar. 2004, pp. 820-825.
Lee, H., et al., "A Flexible Space-Time Coding System with Unequal Error Protection", Proceedings of Vehicular Technology Conference, Stockholm, Sweden, May 2005, 5 pages.
Lee, I., et al., "Reduced-Complexity Receiver Structures for Space-Time Bit-Interleaved Coded Modulation Systems", IEEE Transactions on Communications, vol. 55, No. 1, Jan. 2007, pp. 142-150.
Lee, I., et al., "Code Construction for Space-Time Bit-Interleaved Coded Modulation Systems", Proceedings of the IEEE International Conference on Communications, Jun. 2004, pp. 722-726.
Li, X., et al., "Bit-Interleaved Coded Modulation with Iterative Decoding and 8PSK Signaling", IEEE Transactions on Communications, vol. 50, No. 8, Aug. 2008, pp. 1250-1257.
Noh, Y., et al., "Design of Unequal Error Protection for MIMO-OFDM Systems with Heirarchical Signal Constellations", Journal of Communications and Networks, vol. 9, No. 2, Jun. 2007, pp. 167-176.
Seshadri, N., et al., "List Viterbi Decoding Algorithms with Applications", IEEE Transactions on Communications, vol. 42, No. 2/3/4, Feb./Mar./Apr. 1994, pp. 313-323.
Taoka, H., et al., "Field Experiments on Ultimate Frequency Efficiency Exceeding 30 Bit/Second/Hz Using MLD Signal Direction in MIMO-OFDM Broadband Packet Radio Access", Proceedings of IEEE Conference on Vehicular Technology, Apr. 2007, pp. 2129-2134.
Papadogiannis, et al., "A Dynamic Clustering Approach in Wireless Networks with Multi-Cell Cooperative Processing", IEEE International Conference on Communications, May 19, 2008, pp. 4033-4037.

PCT International Preliminary Report on Patentability for PCT Patent Application No. PCT/US2009/053466, dated Feb. 24, 2011, 9 pages.
PCT International Preliminary Report on Patentability for PCT Patent Application No. PCT/US2009/053471, dated Feb. 24, 2011, 9 pages.
PCT International Preliminary Report on Patentability for PCT Patent Application No. PCT/US2009/054937, dated Mar. 10, 2011, 8 pages.
PCT International Preliminary Report on Patentability for PCT Patent Application No. PCT/US2009/056865, dated Mar. 24, 2011, 12 pgs.
European Office Action for European Patent Application No. 07862325.3, Apr. 7, 2011, 6 pgs.
US Final Office Action for U.S. Appl. No. 12/209,110, dated Jul. 14, 2011, 26 pgs.
US Notice of Allowance for U.S. Appl. No. 11/664,638, dated Jun. 9, 2011, 10 pgs.
US Office Action for U.S. Appl. No. 11/754,903, dated Jun. 6, 2011, 11 pgs.
US Office Action for U.S. Appl. No. 12/538,733, Oct. 18, 2011, 11 pgs.
US Office Action for U.S. Appl. No. 12/538,739, Dec. 7, 2011, 23 pgs.
US Final Office Action for U.S. Appl. No. 12/538,733, Mar. 27, 2012, 6 pgs.
US Office Action for U.S. Appl. No. 12/335,389, Apr. 12, 2012, 20 pgs.
PCT International Preliminary Report on Patentability for PCT Patent Application No. PCT/ US2010/033549, Nov. 17, 2011, 7 pgs.
US Notice of Allowance for U.S. Appl. No. 11/754,903, Mar. 12, 2012, 8 pgs.
US Office Action for U.S. Appl. No. 12/040,653, dated Dec. 11, 2009, 33 pages.
PCT International Preliminary Report on Patentability for PCT Patent Application No. PCT/US2008/003274, dated Sep. 24, 2009, 10 pages.
PCT International Search Report for PCT Patent Application No. PCT/US2007/013074, dated Dec. 2, 2009, 8 pgs.
Written Opinion of the International Searching Authority for PCT Patent Application No. PCT/US2007/013074, dated Dec. 2, 2009, 8 pgs.
PCT International Search Report for PCT Patent Application No. PCT/US2009/046014, dated Nov. 27, 2009, 7 pgs.
Written Opinion of the International Searching Authority for PCT Patent Application No. PCT/US2009/046014, dated Nov. 27, 2009, 8 pgs.
Stiglmayr, Stephan, et al., "Adaptive Coding and Modulation in OFDM Systems using BICM and Rate-Compatible Punctured Codes", 7 pages, Apr. 2007.
G. J. Foschini, H. C. Huang, M. K. Karakayali, R. A. Valenzuela, and S. Venkatesan, "The value of coherent base station coordination," in Proceedings of the 39th Annual Conference on Information Sciences and Systems (CISS '05), The Johns Hopkins University, Baltimore, Md, USA, Mar. 2005.
Yiu, S., et al., "Distritbuted Space-Time Block Coding for Cooperative Networks With Multiple Antenna Nodes", Computational Advances in Multi-Sensor Adaptive Processing, Dec. 13, 2005, pp. 52-55.
Yiu, Simon, et al., "Optimization of Distributed Space-Time Filtering", IEEE 62nd Vehicular Technology Conference, Sep. 2005, pp. 1829-1833, Piscataway, New Jersey, USA.
Adachi, Koichi, et al., "Iterative Modified QRD-M Based on CRC Codes for OFDM MIMO Multiplexing", IEICE Transactions on Communications, Jun. 1, 2007, pp. 1433-1443, vol. E90B, No. 6, Tokyo, Japan.
Detert, Thorben, "An Efficient Fixed Complexity QRD-M Algorithm for MIMO-OFDM using Per-Survivor Slicing", IEEE 4th International Symposium on Wireless Communications Systems, Oct. 1, 2007, pp. 572-576, Piscataway, New Jersey, USA.

* cited by examiner

Perform a first decoding operation to produce a first set of output data representing most likely decision values for the transmitted bits and reliability values for these decisions, including performing a SOMA-based MIMO detection process over each tone for joint inner demapping, including identifying a best candidate among a number of candidates by searching a detection tree for each tone using a forward pass through the detection tree, where only a number of best alternatives from every level of the tree are expanded and where soft-output related information is collected and stored, and performing a second pass, following the forward pass, during which soft output information is computed for each bit
102

Perform a second decoding operation with a binary outer coder
103

FIG. 1

ADAPTIVE FORWARD-BACKWARD SOFT OUTPUT M-ALGORITHM RECEIVER STRUCTURES

PRIORITY

The present patent application claims priority to and incorporates by reference the corresponding provisional patent application Ser. No. 61/034,409, titled, "Adaptive Forward-Backward Soft Output M-Algorithm Receiver Structures for MIMO/OFDM/QAM Systems with BICM/ID," filed on Mar. 6, 2008.

FIELD OF THE INVENTION

The present invention relates to the field of adaptive reduced-complexity receiver structures for receiving information over wireless systems with multiple transmit antennas and, potentially, multiple receive antennas; more particularly, the present invention relates to inner/outer decoder structures with a possibly optimal outer decoder and inner decoders based on a forward-backward version of the soft output M-algorithm (SOMA).

BACKGROUND OF THE INVENTION

Future wireless systems require efficient utilization of the radio frequency spectrum in order to increase the data rate achievable within a given transmission bandwidth. This can be accomplished by employing multiple transmit and receive antennas combined with signal processing. A number of recently developed techniques and emerging standards are based on employing multiple antennas at a base station to improve the reliability of data communication over wireless media without compromising the effective data rate of the wireless systems. So called space-time block-codes (STBCs) are used to this end.

Specifically, recent advances in wireless communications have demonstrated that by jointly encoding symbols over time and transmit antennas at a base station one can obtain reliability (diversity) benefits as well as increases in the effective data rate from the base station to each wireless user. These multiplexing (throughput) gain and diversity benefits depend on the space-time coding techniques employed at the base station. The multiplexing gains and diversity benefits are also inherently dependent on the number of transmit and receive antennas in the system being deployed, in the sense that they are fundamentally limited by the multiplexing-diversity trade-offs curves that are dictated by the number of transmit and the number of receive antennas in the system.

For high data rates and wideband transmission, the use of OFDM makes the equalizer unnecessary. With multilevel modems, coded modulation systems can easily be designed by use of an outer binary code, such as a convolutional code, and an interleaver in a so called bit-interleaved coded modulation (BICM) system.

There are a number of existing receiver structures for the transmission systems that combine the use of MIMO, OFDM, and BICM, that is, for coded MIMO/OFDM/BICM/ID systems. These receivers include an inner-outer decoder structure, whereby the outer decoder is optimally selected. The receivers include iterative decoding (ID) receivers, ID receivers with a MaxLogMAP-based inner decoder, receivers using QRD/M-Algorithm based inner decoder, receivers having MMSE-based inner decoders, and receivers that employ a tree search based on conventional SOMA.

Iterative decoding (ID) receivers with a MAP-based inner decoder have the optimum bit-error-rate performance among all inner/outer decoder structures. However, the MAP-based inner decoder becomes computationally intractable as N (number of transmit antennas/number of QAM symbols that need to be jointly resolved) and b (number of bits represented by each QAM symbol) increase.

ID receivers with a MaxLogMAP-based inner decoder are less complex than the MAP-based system and is asymptotically (high SNR) optimal in that it has near optimum bit-error-rate performance at high SNR. However, the maxlog-MAP-based inner decoder also becomes computationally intractable as N and b increase.

Receivers using QRD/M-Algorithm based inner decoder use a variant of the M-algorithm to produce hard bit estimates along with reliability (soft-output) information. As a result, they can yield drastic reductions in complexity by proper choice of the M parameter, at a cost in bit-error-rate performance. These methods directly employ the conventional M-algorithm, to generate hard-output estimates, and then employ the resulting M candidates to obtain soft information. However, to generate soft information for any bit location, both values of the bit must be available in the pool of the remaining M candidates. As a result, these methods resort to heuristic (and inferior) softify-ing techniques to generate soft output for each bit location for which only one bit value is available in the pool of remaining M candidates. In addition, these receiver structures do not exploit iterative decoding.

Receivers with MMSE-based inner decoders have much lower complexity but suffer in bit-error-rate performance, especially, at higher outer-code rates.

Receivers that employ a tree search based on conventional soft-output M-algorithm, SOMA, do not suffer from having to resort to heuristics for computing reliability information. Instead, in SOMA receivers reliability values are calculated recursively in the forward direction as the M-algorithm is implemented on the tree. These SOMA receivers can also be used for iterative decoding. However, since conventional SOMA receivers recursively compute reliability information in the forward direction, they will sometimes yield reliability values which are not calculated relative to the globally best sequence that is provided by the M-algorithm.

The above set of receiver structures is not exhaustive, but rather representative. There exist many other inner decoder structures in the literature, including spherical decoders, soft-output Viterbi-algorithm (SOVA) based inner-decoders, etc.

SUMMARY OF THE INVENTION

A method and apparatus is disclosed herein for forward-backward SOMA techniques. In one embodiment, the apparatus is a receiver comprising: an inner decoder structure having a soft output M-algorithm (SOMA) based multiple-in multiple-out (MIMO) joint demapper that uses a SOMA-based MIMO detection process to perform joint inner demapping over each tone, where the SOMA-based MIMO joint demapper is operable to identify a best candidate among a number of candidates by searching a detection tree for each tone using a forward pass through the detection tree, where only a number of best alternatives from every level of the tree are expanded and where soft-output related information is collected and stored, and to perform a second pass, following the forward pass, during which soft-output is computed for each bit; and an outer decoder operable with the SOMA-based inner decoder to perform iterative decoding.

BRIEF DESCRIPTION OF THE DRAWINGS

The present invention will be understood more fully from the detailed description given below and from the accompa- FIG. 1 is a flow diagram of one embodiment of a decoding process.

DETAILED DESCRIPTION OF THE PRESENT INVENTION

Figure 2:
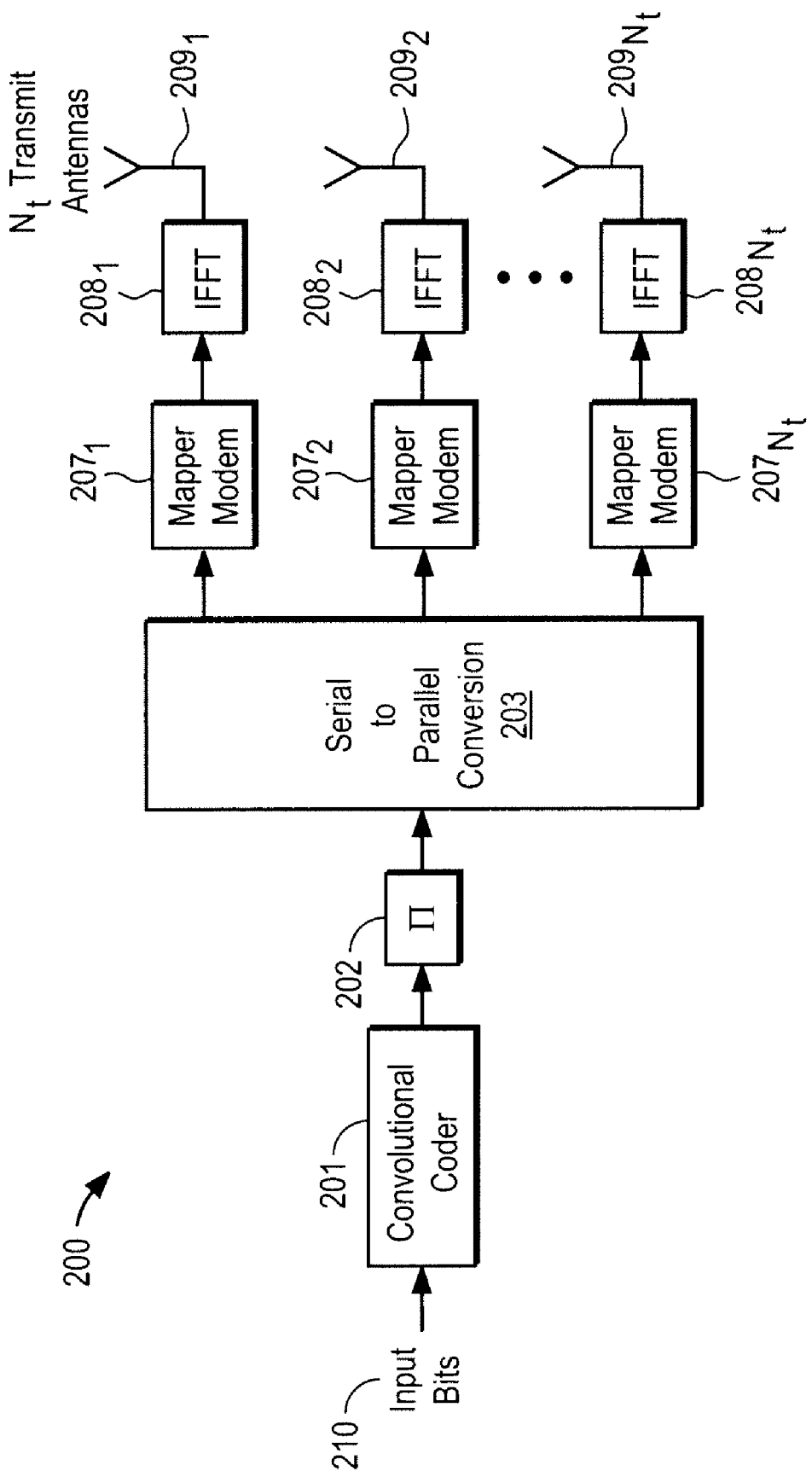
FIG. 2 is a block diagram of one embodiment of a transmitter for space-time coding with bit-interleaved coded modulation (BICM) with OFDM modulation for wideband frequency selective channels where it is assumed as an example that the outer binary code is a convolutional code.

Methods and apparatuses are disclosed for adaptive reduced complexity receiver structures that are based on inner decoders that use a forward-backward SOMA (FB-SOMA), a forward-backward extension of the soft output M-algorithm.

In one embodiment, the receiver includes an inner/outer decoder structure that exploits iterative (turbo-like) decoding. In one embodiment, the iterative decoding is performed using an inner decoder (MIMO joint demapper) and the outer decoder that performs soft-in soft-out (SISO) detection/decoding. The inner decoder is referred to herein as a joint demapper. In one embodiment, the soft-output inner-decoder is implemented by use of a modified soft output M-algorithm, (SOMA). This soft-output MIMO detector is applied on every tone (or, sub-channel) in the OFDM system, as well as at every iteration in the decoding. The number of candidates explored in the SOMA is controlled by the parameter M, the number of paths that are extended from each node or level in the detection tree. It is also affected by the number of the (so-called) early-terminated paths in the tree, since these paths play a key role in the soft output calculations. This value is denoted herein by T and is used in the soft output value calculation by the algorithm. In the overall detection process, the number of iterations, I, is also affecting the total decoding complexity and the associated performance. Note that during any given iteration of the decoding operation, SOMA-based inner decoding is performed independently on each OFDM tone.

In one embodiment, each of the inner demappers, operating on individual OFDM tone, is based on the FB-SOMA, an extension of the SOMA that employs a forward-backward search. In its initial forward pass, a traditional M-algorithm is performed. As the algorithm traverses through the detection tree, it computes the local path metrics, sorts the local candidates, and selects the best M candidates as survivors for further extensions at the next tree depth. Unlike the traditional M-algorithm, however, the remaining paths (non survivors, also referred to as early terminated paths) along with their metrics are stored in memory for future processing. When the full depth of the tree is reached, the best length-N path is selected (also referred to as AML path, or approximately maximum-likelihood path) and is used to obtain estimates of all bits being demapped on the given OFDM tone. The soft (reliability) information for all these bits is then obtained by use of a second (backward) pass through the tree. In this second pass, for each bit location, the reliability metric obtained is the difference in the path metric of the AML path and that of the longest and best path that disagrees on its estimate with the AML path on that location. By performing the search backwards, these metrics are computed with comparisons against the longest possible paths first, while the best path for a given length is locally selected at each depth by selecting the highest sorted candidate at that length. As a result, once a reliability estimate is computed for a bit location, at a given depth within the backward search, this bit location need no longer be revisited for a reliability update during the search.

In the following description, numerous details are set forth to provide a more thorough explanation of the present invention. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; etc.

Overview

A wireless communication system a first device (e.g., a base station) having a transmitter and a second device having a receiver (e.g., a mobile terminal) to receive information-bearing signals from the transmitter wirelessly transmitted using OFDM and bit interleaved coded modulation is described. In one embodiment, the communication system described herein is a coded modulation system that includes transmitters that apply space-time coding with bit-interleaved coded modulation that is combined with a multi-carrier OFDM modulation and receivers that apply OFDM demodulation with iterative demapping and decoding. The systems described herein have $N_t$ transmit antennas and $N_r$ receive antennas. Each of the $N_r$ receive antennas receives signals that are the sum of channel-distorted versions of the signals transmitted from the $N_t$ transmit antennas. Such coded modulation systems in accordance with the present invention may be advantageously employed in wireless local/wide area network (LAN/WAN) applications.

In one embodiment, the space-time coding system described herein comprises OFDM for wideband transmission, MIMO and large QAM constellations for high spectral efficiency, a bit interleaver for the bit-interleaved coded modulation scheme (BICM) and an outer binary code. The overall detection is typically performed iteratively. This requires that both the inner MIMO demapper and the outer decoder perform soft in soft out (SISO) detection/decoding. One system component contributing to the complexity is typically the joint demapper as explained above. The outer decoder is less critical in terms of complexity. In one embodiment, the MIMO detector in principle works with any binary outer code. This code could be a turbo code, an LDPC code, a regular convolutional code or an RCPC code. The decoder for the outer code is preferably a soft in soft out (SISO) type decoder, for example a MAP decoder. The outer decoder supplies soft information to the inner MIMO detector for iterative decoding.

While the exemplary embodiment is described for space-time coding with bit-interleaved coded modulation, other types of coded modulation for space-time coding may be used. In addition, the exemplary embodiments are described for a mapping of the bit-interleaved coded data into symbols using QAM; however, other modulation schemes may be used, such as, for example, but not limited to phase-shift keying (PSK).

Generally, the receiver includes circuitry that estimates the values for the elements in channel response matrix H[f], and such estimates may be generated using periodic test (pilot) signals transmitted by the transmitter to the receiver. Such a priori information of the channel impulse response may also be generated via simulations. The matrix H[f] denotes the channel response over the fth OFDM tone and is a matrix of dimensions $N_r$ by $N_t$.

When combined with signal processing, multiple transmit and receive antennas can yield communication links with increased bandwidth efficiency (data rate), extended power efficiency (range), or both. Embodiments of the invention deals primarily with the forward link, i.e., the base-to-mobile transmission direction of transmission. Methods and apparatuses are disclosed for adaptive soft output M-algorithm based receiver structures.

In one embodiment, a reduced complexity soft output MIMO detector in the receiver makes use of a modified soft output M-algorithm (SOMA). In one embodiment, the soft output MIMO detector is applied for every tone or subchannel in the OFDM system, as well as at every iteration in the decoding process. To illustrate the advantages of the SOMA demapper, consider for illustration the optimum MIMO detector, referred to as a maximum a posteriori probability (MAP) detector. The MAP performs a joint demapping function over all the transmit antennas and over all the involved QAM constellation symbols and bits. Consider also for illustration the asymptotically optimum but simpler (with respect to the MAP) exhaustive MaxLogMAP detection algorithm. Even in the simpler MaxLogMAP detector an exhaustive demapping operation is required and it involves a search space that is growing exponentially with the product of the number of transmit antennas ($N_t$) and the number of bits per QAM constellation point (B). For example, with a 6 by 6 MIMO system (6 transmit antennas and 6 receive antennas) using 64 QAM modulation (6 bits per constellation point) this product is 36. In such a case, the decoding complexity is of the order of $2^{36}$, and the MaxLogMAP cannot be implemented with the technology of today. In contrast, in one embodiment, the SOMA detector only uses a small fraction of the total number of candidates in its MIMO detection process, thus the considerable complexity reduction. There is of course a tradeoff between the performance and the degree of complexity reduction.

In one embodiment, as described in further detail below, the SOMA is used adaptively, in that the tree-search symbol order when performing a detection search is adapted by each SOMA module (one per OFDM tone) according to the channel conditions (on the given OFDM tone) in order to optimize the overall complexity-performance trade-offs of the receiver. More specifically, during every inner/outer decoder iteration, a SOMA detector performs a SOMA detection process on each OFDM tone. In one embodiment, the number of candidates explored in the SOMA detection process is controlled by the parameter (M) that indicates the number of paths that are extended from each node or level in the detection tree. In particular, at any given level in the detection tree, only a subset M of the visited candidates are kept as survivors and are going to be extended at the next level. The rest of the candidates tested at this level are referred to as early-terminated paths. The early terminated paths are used by the SOMA for performing soft-output calculations. In one embodiment, the number of early terminated paths that are explored in the SOMA detection process is also an adaptation parameter as these paths also play a role in the soft output calculations. For purposes herein, this value is denoted T and is used in the soft output value calculation by the algorithm. In the overall detection process the number of inner/outer decoder iterations, I, also affects the total decoding complexity and the associated performance.

In one embodiment, the SOMA process performed by the receiver is referred to herein as a forward-backward SOMA (FB-SOMA), and is based on a forward pass and a backward pass through a detection tree. The FB-SOMA process performs a search through the detection tree via a M-algorithm in a manner well-known in the art, while recursively collecting soft-output information. The FB-SOMA process also uses the value that the best visited full-length codeword takes on any given bit location as its hard-estimate for that bit. Furthermore, the soft information on this bit is computed as the difference between two, same-length path metrics, that differ in their value on the given bit location. Unlike the SOMA, however, in the FB-SOMA the soft information on this bit is computed as the difference between a metric of the best visited full-length codeword and the metric of the longest alternative-decision path visited, i.e., the best visited path with a different decision on the given bit from that of the best visited full-length path. Thus, the FB-SOMA soft-output on any bit is the metric difference between the best and longest paths visited with decisions 1 and 0 on that bit location.

More specifically, in the forward pass, the FB-SOMA process collects the best and longest path metrics associated with all the alternative bit decisions. In particular, assume that at depth i-1, there are survivor paths for each bit value at a given bit location. If the depth-i survivor paths all agree in value at that bit location, then the best early terminated path with an alternative decision at depth i is used as the metric for the alternative decision path in the bit soft-output calculation. The other path used in this soft-output calculation is the length-i partial-metric of the best full-length path. To ensure that this partial metric is available at the end of the forward search, at depth i (for each i) all partial paths (lengths 1 to i) of all survivors at length i are stored and propagated through the tree. Then, in the backward pass, the nodes in the best full-length path are traced backwards and all the soft-output computations are computed against its partial metrics and the associated alternative-decision metrics.

FB-SOMAs have several attractive properties. Among all soft-output algorithms based on an M-algorithm tree-search, the FB-SOMA yields the highest-quality soft output, subject to the MaxLogMAP criterion. In comparison to the basic SOMA, the FB-SOMA delays the collection of soft-output information until a second, backward pass. Therefore, additional storage of intermediate path metric computations is performed. Unlike the basic SOMA, for the FB-SOMA, the soft-output bit-LLR approximations have the following properties:

(a) The bit-LLR approximations are formed using: (i) the best (full-length) path; and (ii) the longest and best visited path with the opposite decision on the bit of interest.

(b) The number of computations used to obtain these bit-LLR approximations is the smallest possible.

(c) The metric used for the best full-length path is at most as large as the metric used for the alternative path.

FIG. 1 is a flow diagram of one embodiment of a decoding process for producing a first set of output data representing most likely transmitted bit estimation values and information about the reliability of each of these estimates. The process may be performed by processing logic that may comprise hardware (e.g., dedicated logic, circuitry, etc.), software (such as is run on a general purpose computer system or a dedicated machine), or a combination of both. In one embodiment, the decoding process is performed by a receiver in the wireless communication system.

Referring to FIG. 1, the process begins by performing a SOMA-based MIMO detection process over each tone for joint inner demapping, by identifying a best candidate among a number of candidates by searching a detection tree for each tone in the forward direction, collecting and storing soft output information during the forward search, and by performing a second pass during which soft output is computed for each bit (processing block 102).

The process also includes calculating a soft output value for each bit by comparing a metric of partial path from an estimated best path with the metric of the longest and best visited path with an opposite decision on that bit (processing block 103).

In one embodiment, involving an OFDM based system with one MIMO detector for each tone, the complexity reduction in the SOMA based detector is implemented adaptively for each tone by use of symbol reordering followed by a SOMA-based decoder. In one embodiment, the reordering process is a relatively simple procedure based on CSI that is collected at the receiver (regardless of whether or not tree reordering is performed). The SOMA decoder employed over each tone can be fixed (using fixed M, I, T parameters) or it can be channel adaptive. The M value used in the SOMA tree may be fixed or it may vary over the decoding tree. In such a system, a maxlogMAP metric can be employed.

In one embodiment, the parameters M and T and/or I are selected adaptively for the best overall performance for a given total complexity level, with the quantity that guides the adaptivity being the quality of the different OFDM tones. For example, a high signal level or alternatively a large signal to noise ratio (SNR) for a certain tone means a good quality level for that tone. In such a case, the SOMA detection process performs decoding with a lower value of M, a lower value of T and potentially a lower value of I. On the other hand, for a tone of poor quality, i.e. a tone with low signal level or low SNR, the SOMA detection process performs decoding with higher values of M, T and I for the best use of the overall complexity. The adaptivity can also be extended over time, i.e. over successive OFDM symbols.

Transmitter and Receiver Embodiments

Figure 3:
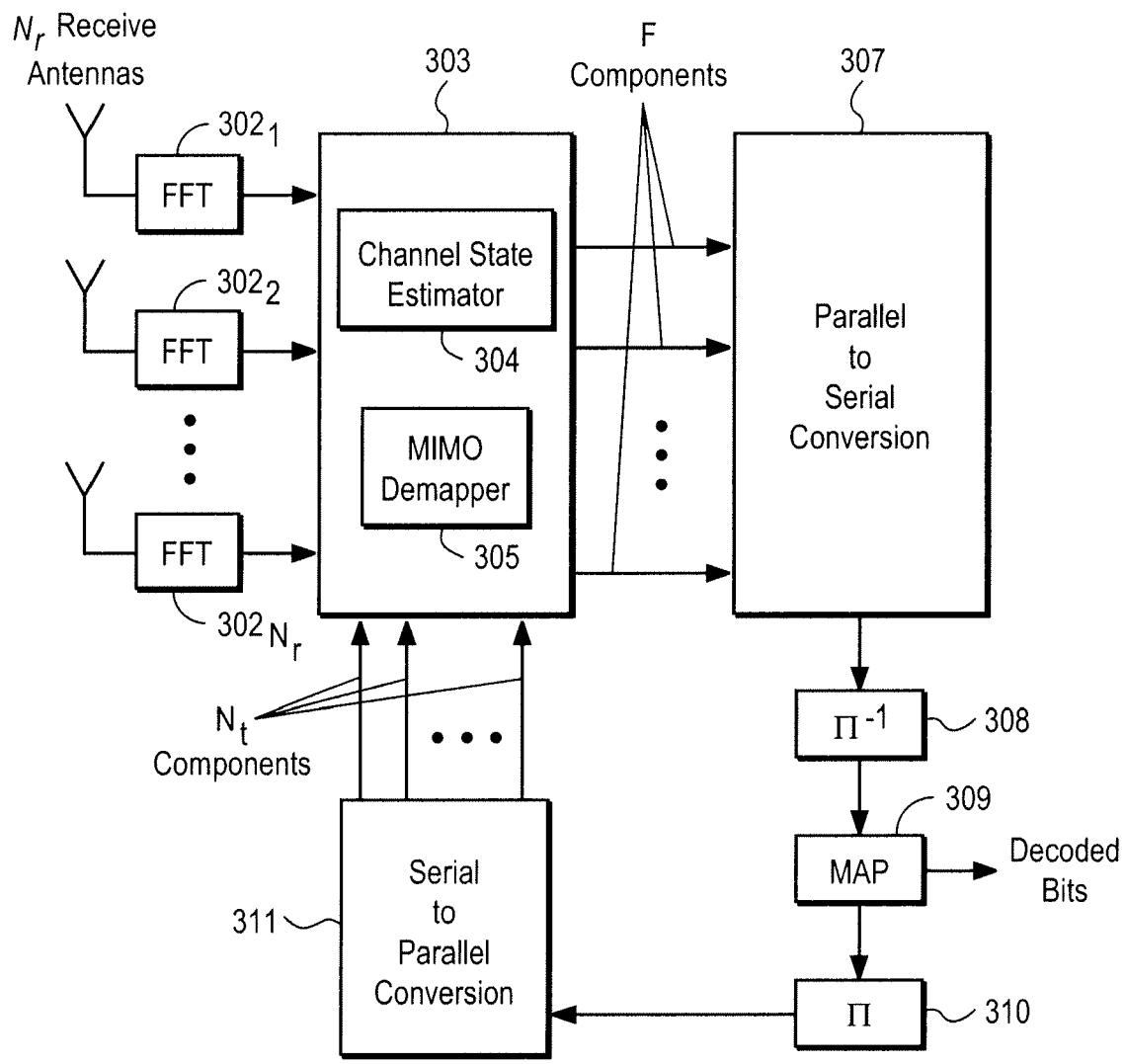
FIG. 3 is a block diagram of one embodiment of a receiver having an iterative decoder for the coded OFDM system shown in FIG. 2.

FIGS. 2 and 3 show the transmitter and receiver block diagrams for a MIMO/OFDM system with BICM and ID. More specifically, FIG. 2 is a block diagram of one embodiment of a transmitter for space-time coding with bit-interleaved coded modulation (BICM) with OFDM modulation for wideband frequency selective channels. Referring to FIG. 2, transmitter 200 comprises (as an example) convolutional encoder 201, bit interleaver 202, serial-to-parallel converter 203, mapper modems $207_1$-$207_{Nt}$, inverse fast Fourier transform (IFFT) modules $208_1$-$208_{Nt}$, and transmit antennas $209_1$-$209_{Nt}$. Note that IFFT modules $208_1$-$208_{Nt}$ also include circular-prefix operations, which are performed in a manner that is well known in the art. Also the resulting sequences generated by the IFFT/circular prefix modules are converted into electrical continuous-time signals via pulse-amplitude modulation in a manner that is well known in the art.

To perform BICM encoding to the data, convolutional coder 201 applies a binary convolutional code to the input bits (input data) 210. Bit interleaver 202 then interleaves the encoded bits from convolutional coder 201 to generate bit-interleaved encoded bits. This bit interleaving de-correlates the fading channel, maximizes diversity, removes correlation in the sequence of convolutionally encoded bits from convolutional coder 201, and conditions the data for increased performance of iterative decoding. Convolutional coder 201 and bit interleaver 202 may typically operate on distinct blocks of input data, such as data packets.

After performing bit interleaving, bit-mapping and modulation and OFDM are applied to the bit-interleaved encoded bits. Serial-to-parallel converter 203 receives the serial bit-interleaved encoded bit stream from bit interleaver 202. Note that serial-to-parallel converter 203 may include a framing module (not shown) to insert framing information into the bit stream, which allows a receiver to synchronize its decoding on distinct blocks of information. Serial-to-parallel converter 203 generates a word of length $N_t$ long, with each element of the word provided to a corresponding one of mapper modems $207_1$-$207_{Nt}$. Elements of the word may be single bit values, or may be B bit values where B is the number of bits represented by each modem constellation symbol.

Each of mapper modems $207_1$-$207_{Nt}$ converts B bits to corresponding symbols (of the Q-ary symbol space, with $Q=2^B$). The output of each modem mapper 207 is a symbol. Each of IFFT modules $208_1$-$208_{Nt}$ collects up to F symbols, and then apply the IFFT operation of length F to the block of F symbols. F is an integer whose value can typically range from 64 to 4096, or larger and depends on the available transmission bandwidth, the carrier frequency, and the amount of Doppler shifts that need to be accommodated by the system. Thus, each of IFFT modules $208_1$-$208_{Nt}$ generate F parallel subchannels that may be transmitted over corresponding antennas $209_1$-$209_{Nt}$. Each subchannel is a modulated subcarrier that is transmitted over the channel.

In embodiment, the transmitter and receivers have an equal number of transmit and receive antennas, i.e., $N_t=N_r=N$. The binary information bearing signal, hereby denoted as $u_k$, is encoded first at the transmitter by an outer binary code using convolutional coder 201, generating a coded sequence $c_k$. This sequence is interleaved by a bit interleaver 202. Then, each of mapper modems $207_1$-$207_{Nt}$ maps groups of B interleaved bits at a time into $2^B$-QAM symbols. The resulting QAM symbols are multiplexed through the N transmit antennas $209_1$-$209_{Nt}$ in a round-robin fashion and OFDM transmission is applied over each antenna using IFFT modules $208_1$-$208_{Nt}$. For convenience, for purposes herein, $s_k[n]$, the QAM symbol transmitted by antenna k on tone n, and via $b_k^l[n]$ the lth out of the B bits is used as input in one of mapper modems $207_1$-$207_{Nt}$ to produce $s_k[n]$. Letting $b_k[n]=[b_k^1[n], b_k^2[n], \ldots, b_k^B[n]]$, then, $$s_k[n]=\text{map}(b_k[n]) \quad (1)$$

where map denotes the mapper operation. FIG. 5 shows such a mapping for B=4.

FIG. 3 is a block diagram of one embodiment of a receiver having an iterative decoder for the space-time code for the OFDM system. Referring to FIG. 3, receiver 300 comprises receive antennas $301_1$-$301_{Nr}$, fast Fourier transform (FFT) modules $302_1$-$302_{Nr}$, demodulator/detector 303, parallel-to-serial converter 307, bit deinterleaver 308, maximum a posteriori (MAP) decoder 309, bit interleaver 310, and serial-to-parallel converter 311. Although not shown, each of the FFT modules $302_1$-$302_{Nr}$ is preceded by front end that performs filtering, sampling, and a circular-prefix-removal operation.

For a wideband system, receiver 300 performs OFDM demodulation for each of receive antennas $301_{1-Nr}$, and the demodulation and demapping is performed over F parallel subchannels. The ith receive antenna $301(i)$ senses a signal made up of various contributions of the signals transmitted from the $N_t$ transmit antennas (i.e., contributions of the multiple F parallel, narrowband, flat fading subchannels transmitted over corresponding antennas $209_1$-$209_{Nt}$ of FIG. 2). Each of FFT modules $302_1$-$302_{Nr}$ apply an F-point FFT to the corresponding signals of receive antennas $301_1$-$301_{Nr}$, generating $N_r$ parallel sets of F subchannels.

In one embodiment, demodulator/detector 303 estimates bits in each of the F subchannels. Multi-input multi-output (MIMO) demapper 305, based on the $N_r$ parallel sets of F subchannels from FFT modules $302_1$-$302_{Nr}$ produces soft estimates of the demapped bits (i.e., bits mapped from the constellation symbol) in each of the F subchannels from the $N_t$ antennas in the transmitter. MIMO demapper 305 produces the estimates of the demapped bits and reliability information about these bits using reliability information generated by soft-output decoding (followed by reinterleaving) by MAP decoder 309.

Figure 4:
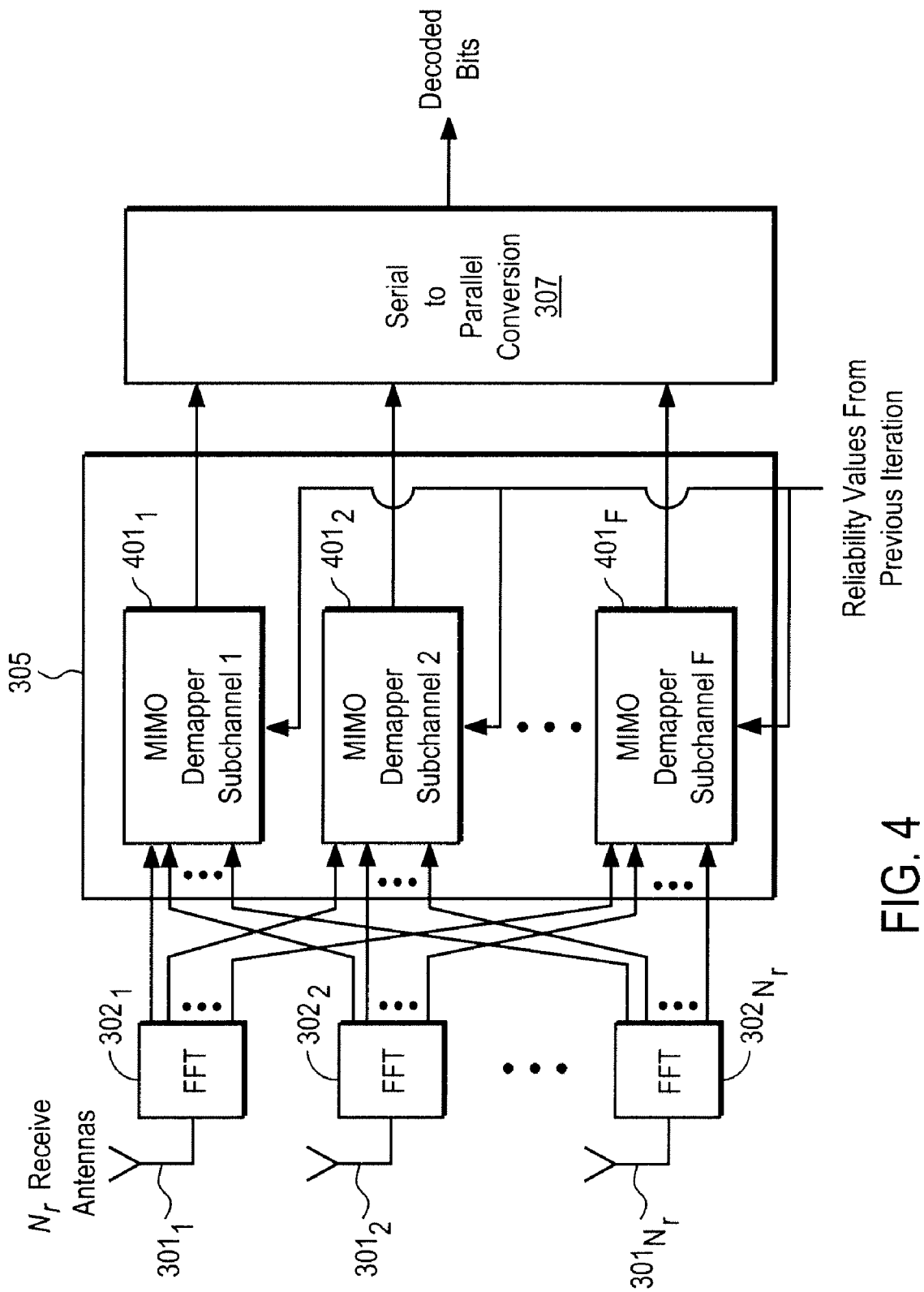
FIG. 4 is a block diagram of one embodiment of the MIMO demapper having MIMO joint demapper units with distinct demappers for the different OFDM tones for the MIMO/OFDM system with BICM/ID.

In one embodiment, MIMO demapper 305 computes soft values for bits transmitted on the overlapping F subchannels, along with an estimate (approximation) of the a posteriori probability of the soft value being correct. FIG. 4 is a block diagram of one embodiment of MIMO demapper 305 having MIMO joint demapper units for the different OFDM tones/subchannels. Referring to FIG. 4, each signal of the $N_r$ receive antennas $301_1$-$301_{Nr}$ is divided into F subchannels (via demodulator 304, not shown in FIG. 4) by applying the FFT and sent to corresponding subchannel MIMO demappers $401_1$-$401_F$. The signal outputs of the $kt_h$ subchannel for all $N_r$ receive antennas are provided to the kth subchannel MIMO demapper $401(k)$. After the first iteration reliability information is provided to the kth subchannel MIMO demapper $401(k)$, using extrinsic information generated by the output of MAP decoder 309 at the previous iteration. The extrinsic information is exchanged between MIMO demapper 305 and MAP decoder 309 to improve the bit error rate performance at each iteration. Methods for computing the extrinsic information in such inner/outer decoder settings are well-known in the art. In the first iteration, there is no extrinsic information input to the soft demapper. In subsequent iterations, in one embodiment, the extrinsic information is computed as follows. First, the soft-output is computed by the MAP outer decoder, and from it the input reliability information (input to the same outer decoder) is subtracted off in order to compute the extrinsic information produced by MAP decoder 309. This extrinsic information is deinterleaved and passed as input to MIMO demapper 305 in the next iteration.

Returning to FIG. 3, the estimates of bits in F parallel streams from MIMO demapper 305 together with reliability values for those bits are provided to parallel-to-serial converter 307 along with the extrinsic reliability information on each one of these bits. The reliability information is computed as the difference between the output reliability values for those bits (produced by demapper 305) and the input reliability values for those bits (inputs to demapper 305). The converter 307 reconstitutes the estimate of the BICM encoded bit stream generated by the transmitter, which was estimated by the receiver 300. The estimated BICM encoded bit stream (and the extrinsic reliability information) is then deinterleaved by bit deinterleaver 308 and applied to MAP decoder 309 to reverse the convolutional encoding applied by the transmitter. The reverse operation in this case corresponds to generating estimates of the bit values of the information bit stream that is the input to convolutional coder 201, and also producing extrinsic information that is to be passed back (after reinterleaving) to MIMO demapper 303 as new reliability information.

The MAP decoding process generates soft output values for the transmitted information bits in a manner that is well known in the art.

The extrinsic information from MAP decoder 309 is first applied to bit interleaver 310. Bit interleaving aligns elements of the extrinsic information with the interleaved estimated BICM encoded bitstream from MIMO demapper 305. In addition, the interleaved extrinsic information is applied to serial-to-parallel converter 311, which forms $N_t$ parallel streams of extrinsic information corresponding to the parallel bit streams formed at the transmitter.

The extrinsic information is exchanged between MIMO demapper 305 and MAP decoder 309 to improve the bit error rate performance at each iteration. In one embodiment, a MaxLogMAP-type approximation is used to compute bit-LLR values for each bit location. In another embodiment, an improved Max-Log approximation for calculation of LLRs can be used in MAP decoder 309 associated with the convolutional code used as an outer encoder in the transmission scheme. The improved Max-Log approximation for calculation of a posteriori LLR values may employ the max* term relationship of the following equation:

$$\max{}^*(x,y) = \log(e^x + e^y) = \max(x,y) + \log(1 + e^{-|x-y|})$$

when calculating updated forward recursive, reverse recursive, and branch metrics sequences to calculate the LLR. Each constituent MIMO demapper 305 or MAP decoder 309 thus calculates the max* term by separate calculation of a max term (max(x,y)) and a logarithmic correction term (log $(1+e^{-|x-y|})$).

Figures 5A, 5B:
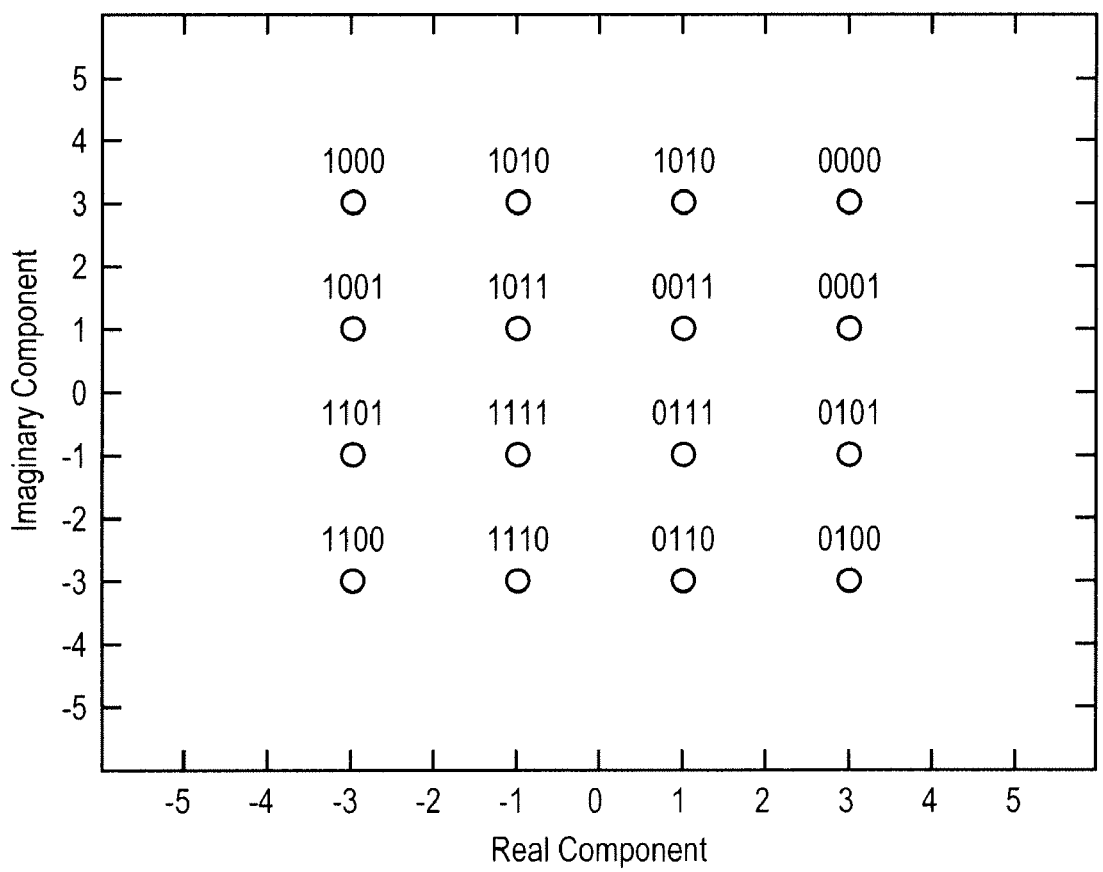
FIG. 5A illustrates a set partition type mapper for 16 QAM.
FIG. 5B illustrates a Gray mapper for 16 QAM.

FIG. 5A illustrates one embodiment of a so called set partition type mapper for 16QAM for use in iterative decoding. This type of mapper is sometimes suitable for BICM with iterative decoding (ID) in contrast to the Gray mapper which is always suitable for a non-iterative decoding process, and is shown in FIG. 5B.

An Example of an Inner Decoder Structure

After OFDM front-end preprocessing, the samples from each receive antenna and on each tone are passed through an inner/outer soft-in soft-out decoder structure for decoding shown in FIGS. 3 and 4, which are described above. Also as described above, in one embodiment, the outer decoder is an optimal (soft-in soft-out) MAP decoder. The complexity of the near-optimal receivers associated with these types of coded OFDM/BICM/OFDM systems resides in the inner decoder of the receiver structure in FIG. 3. The received signal sample on the mth receive antenna and the nth tone can be expressed as $$y_m[n] = \sum_k h_{km}[n]s_k[n] + w_m[n] \qquad (2)$$

where $h_{mk}[n]$ denotes the effective channel gain between the kth transmit and the mth receive antenna on the nth tone, $w_m[n]$ denotes the associated thermal noise term on the mth antenna and nth tone. Alternatively, (2) can be compactly re-expressed as follows, $$y[n] = H[n]s[n] + w[n] \qquad (3)$$

where $h[n]=[h_1[n]\ h_2[n]\ldots h_N[n]]^T$ with $h_m[n]=[h_{1m}[n]\ h_{2m}[n]\ldots h_{Nm}[n]]^T$, and where $s[n]=[s_1[n]\ s_2[n]\ldots s_N[n]]^T$, and y[n] and w[n] are similarly defined and where it is assumed that $N_t = N_r = N$.

In one embodiment, the channel state information (CSI) is not available at the transmitter, but CSI is fully available at the receiver; that is, the set of H[n]'s is known at the receiver but not at the transmitter.

On each OFDM tone, N QAM symbols are transmitted simultaneously and each of the N receive antennas receives a linear combination of these N symbols (whereby the linear combination is dictated by the instantaneous channel coefficients).

As stated above, in one embodiment, the receiver uses a modified version of the soft output M-algorithm (SOMA). The SOMA is well known in the art; see, for example, Wong, "The Soft Output M-algorithm and its applications", Ph.D. Thesis, Queens University, Kingston, Canada, August 2006, incorporated herein by reference. In one embodiment, the modified soft output M-algorithm (SOMA) is used adaptively. The M-algorithm is well known in the art and is described in Lin & Costello, "Error Control Coding, $2^{nd}$ Edition," Prentice Hall, New York, 2003.

In contrast to the basic M-algorithm which does not give soft output values, in one embodiment, the joint demapper uses the modified SOMA for finding the best alternative among an exponentially growing population of candidates by doing a reduced search in a detection tree. This is done by expanding only the M best alternatives from every level of the tree rather than all alternatives. In one embodiment, the M best alternatives are determined using a metric. In one embodiment, the metric is so called MaxLogMAP type metric, such as described in Lin & Costello, "Error Control Coding, $2^{nd}$ Edition," Prentice Hall, New York, 2003, which is well-known in the art.

Based on the search through the detection tree, the joint demapper calculates soft output values by comparing the estimated best path (the best visited path) with the longest opposite decision path visited (the best visited path with a different decision on the given bit from that of the best visited full-length path). These paths through the levels of the tree could be terminated at the end of the tree (there are M such paths) or non-terminated at every level (there are T early-terminated paths).

The soft output values from the inner SOMA-based MIMO joint demapper are then used by the soft in soft out (SISO) decoder for the outer binary code. This decoder in turn feeds soft values back to the inner decoder in an iterative turbo-type iterative decoding. In another embodiment, a soft-input hard-output Viterbi decoder (i.e., a simpler outer decoder) uses the soft output values from the inner SOMA-based MIMO joint demapper to produce hard output data for non-iterative decoding.

In one embodiment, the parameters in the SOMA-based inner decoder are channel-adaptive. Such channel-adaptive versions of SOMA inner decoders save in complexity (with respect to the base SOMA designs) without appreciable reduction in performance, as well as being optimizable for a given channel realization to a desired target BER performance.

In one embodiment, the SOMA algorithm computes (estimated) symbol decision values and reliability information for the associated bit estimates by first turning the computation above into a computation on a tree and then performing approximate maximization computations by limiting the search through the tree.

Next the focus is on the SOMA operating on a fixed but arbitrary OFDM tone n. For convenience, the dependence of all variables vectors and matrices on the OFDM index, n, has been omitted. In one embodiment, the mapping of the Max-LogMAP demapper computations on a tree structure is based on exploiting the QR-type decompositions of the channel matrix is described. Let $\pi: \{1, \ldots, N\}: \{1, \ldots, N\}$ denote a permutation function, $s^{(\pi)} = [s_{\pi(1)} s_{\pi(2)} \cdots s_{\pi(N)}]^T$ denote the associated N-symbol permutation of s, and $P^{(\pi)}$ denote the associated permutation matrix, i.e., the matrix yielding $s^{(\pi)} = P^{\pi} s$.

Figure 12:
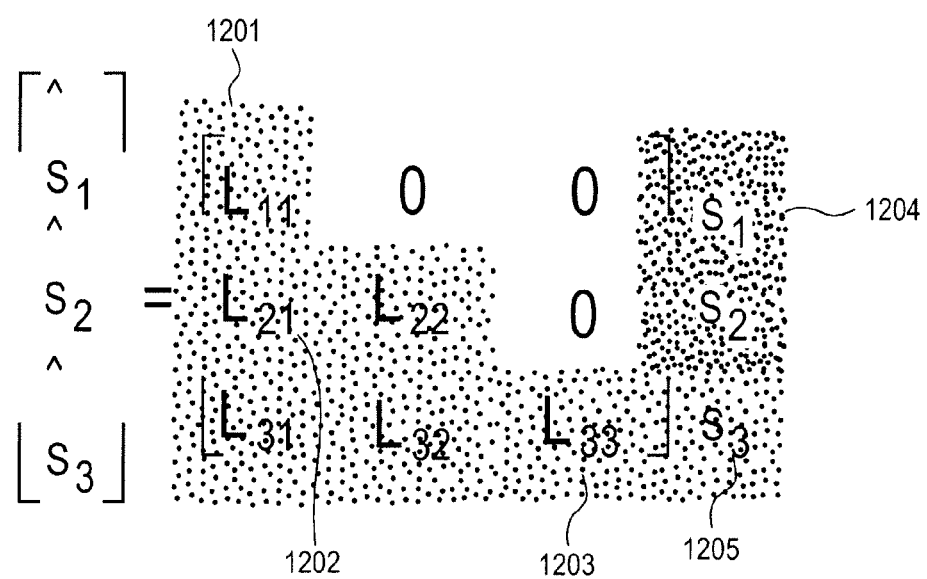
FIG. 12 illustrates the result of a QR decomposition.

Associated with any fixed order $\pi$, the decomposition expresses the channel matrix H from equation (3) as $H^{(\pi)} = H[P^{(\pi)}]^T$ in the form $H^{(\pi)} = Q^{(\pi)} L^{(\pi)}$ with $Q^{(\pi)}$ unitary and $L^{(\pi)}$ lower triangular. As a result, the information lossless projection operation of y onto $[Q^{(\pi)}]^H$ yields a vector $\tilde{y}$ that constitutes a set of measurements that are equivalent to those in y from equation (3) and which can be represented as follows $$\tilde{y} = L^{(\pi)} s^{(\pi)} + \tilde{w}. \tag{4}$$

whereby $l_{ij}^{(\pi)} = \{L^{\pi}\} i,j$, and $l_{ij}^{(\pi)} = 0$ when $i > j$. See FIG. 12 for an example, where the structure of the first term in the right hand side of equation (4) is illustrated for $N_t = N_r = N = 3$.

Given an equation for $\tilde{y}$ given above, the full-search Max-LogMAP can be readily implemented based on the above set of measurements via a search on a tree. At depth k in the tree, only the k first equations are considered from equation (4) to rank candidates. As these equations depend only on the k first symbols in $s^{(\pi)}$, the sets of candidates are ranked in groups whereby each group corresponds to all the N-symbol candidates that have the same symbol values in the first k symbols in the order described by $\pi$. In particular, letting $\tilde{s}$, denote an arbitrary N×1 vector of $2^B$ QAM symbol values, $\tilde{s}_m = [\tilde{s}]_m$, and $\{\tilde{b}_m^1, \tilde{b}_m^2, \ldots \tilde{b}_m^B,\}$ denote the associated values of the kth bits that map to $\tilde{s}_m$, the MaxLogMAP computation reduces to $$L(\tilde{b}_m^k) = \max_{\tilde{s}: \tilde{b}_m^k=1} \Gamma(\tilde{s}, \hat{s}) - \max_{\tilde{s}: \tilde{b}_m^k=0} \Gamma(\tilde{s}, \hat{s}) \tag{5}$$

where $\hat{s} = [L^{(\pi)}]^{-1} y$ and $$\Gamma(\tilde{s}, \hat{s}) = \sum_{m=1}^{N} \left\| l_{mn}^{(\pi)}(\tilde{s}_m - \hat{s}_m) + \sum_{n=1}^{m-1} l_{mn}^{(\pi)}(\tilde{s}_n - \hat{s}_n) \right\|^2 \tag{6}$$

The quantities $\Gamma(\tilde{s}, \hat{s})$ can be readily implemented recursively via a full tree-search on a tree of depth N and $2^B$ branches per node.

The conventional SOMA algorithm, in essence, performs a limited MaxLogMAP-metric based search on the tree. Like any M-algorithm, from all surviving candidates at any given level, all possible candidates are expanded to the next level ($2^B$M in this case), but only a subset M of those is kept for search at higher depths in the tree. An important element of the SOMA is that it recursively generates and updates quality metric estimates for each value of each of the NB bits represented on the tree. In particular, it exploits the use of two N×B matrices $\Delta^{(0)}$ and $\Delta^{(1)}$, whereby the relative reliability metrics associated with the values 0 and the 1 of the kth bit in $s_m$ are given by $\delta^{(0)}_{m,k} = [\Delta^{(0)}]_{m,k}$ and $\delta^{(1)}_{m,k} = [\Delta^{(1)}]_{m,k}$, respectively. The scheme relies recursively extending each surviving path at level m to its $2^B$ path extensions at the next level, computing the cumulative metrics for the new paths and sorting the paths in the order of decreasing metrics. If $p_{[l,i],r}$ denote the rth ranked path at depth I, then the M top paths, i.e., the paths in the set $\{p_{[l,i],r}; 1 \leq r \leq M\}$ are retained, while the paths in $\{p_{[l,i],r}; r > M\}$ are terminated. However, a subset of the best $N_{term}$ terminated paths $\{p_{[l,i],r}; M+1 \leq r \leq M+N_{term}\}$ are still used before they are discarded for producing relative reliability updates for the bits and bit values they represent by updating the associated locations in $[\underline{\Delta}^{(0)}]$ and $[\underline{\Delta}^{(1)}]$ (note that T and $N_{term}$ are used interchangeably to denote the number of terminated paths). After the completion at depth N, the SOMA first chooses the surviving length-N path with the best accumulated metric as the hard estimate. This N×1 vector of QAM symbol estimates is used to directly demap and obtain hard estimates for the NB bits $\{\hat{b}_m^k; 1 \leq k \leq B, 1 \leq m \leq N\}$. Reliability metrics are updated in the two matrices based on all length N tree candidates $2 \leq r \leq M = N_{term}$. Then the relative reliability information for the kth bit represented in the mth QAM symbol is given by $$L(\hat{b}_m^k) = [2 \hat{b}_m^k - 1] \delta_{m,k}^{(1-\hat{b}_m^k)} \tag{7}$$

The values of M (surviving candidates per depth) and N-term (the number of candidates used for gathering soft information based on early terminated paths) can be varied to trade off computation complexity with bit-error-rate performance. In the iterative decoding setting, in each iteration cycle, each decoder computes extrinsic information that is passed as input (appropriately deinterleaved in the case of the MIMO demapper, and reinterleaved in the case of the outer MAP decoder) to the other decoder. The extrinsic information is computed as the difference between the soft output information produced by the decoder (e.g., in the case of MIMO demapper see equation (7)), and the input intrinsic information to the decoder. Typically, the extrinsic information passed between decoders for any given particular bit location is in the form of differential values, that is the difference between the "bit=1" value and the "bit=0" reliability value. In one embodiment, if iterative decoding is used, the metric used for SOMA decoding shown in equation (6) is modified to include an extrinsic term. In particular, another term is added to the right hand side of equation (6), which is a sum of terms, one term for each bit location in the binary representation of the symbol $\tilde{s}$. When differential reliability values are employed, the term added that corresponds to any given, but fixed, bit location, equals zero if the bit-value of that bit location in $\tilde{s}$ is 0, and equal to the differential input reliability value otherwise.

Figure 6:
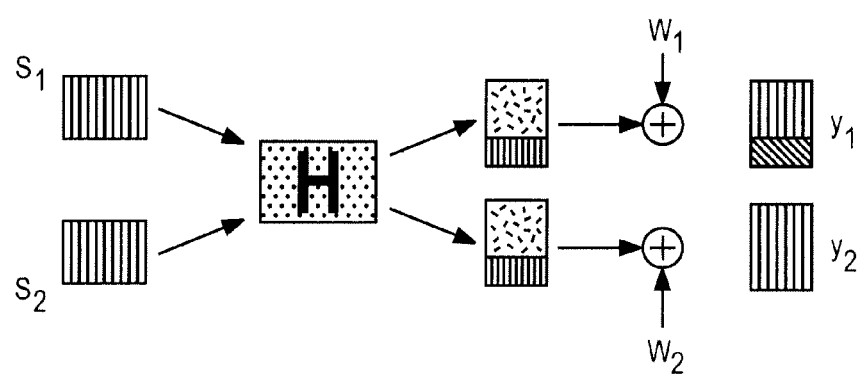
FIG. 6 illustrates the effect of the channel on the transmitted symbols on one OFDM tone, represented as a multiplication of the symbol vector transmitted by the transmit antennas with a matrix H, comprising the channel coefficients between transmit and receive antennas on that OFDM tone.

FIG. 6 illustrates the operation of the MIMO demapper for one subtone for a simple 2×2 example. Referring to FIG. 6, the $y_1$ and $y_2$ signals are generated from the symbols $s_1$ and $s_2$ from first and second antennas. This occurs in a well-known fashion according to the following:

$$\begin{bmatrix} y_1 \\ y_2 \end{bmatrix} = \begin{bmatrix} H_{11} & H_{12} \\ H_{21} & H_{22} \end{bmatrix} \begin{bmatrix} s_1 \\ s_2 \end{bmatrix} + \begin{bmatrix} w_1 \\ w_2 \end{bmatrix}$$

In this case, s is a vector of size $N_t = N_r = N = 2$, and each entry of s corresponds to a constellation symbol.

Figure 7:
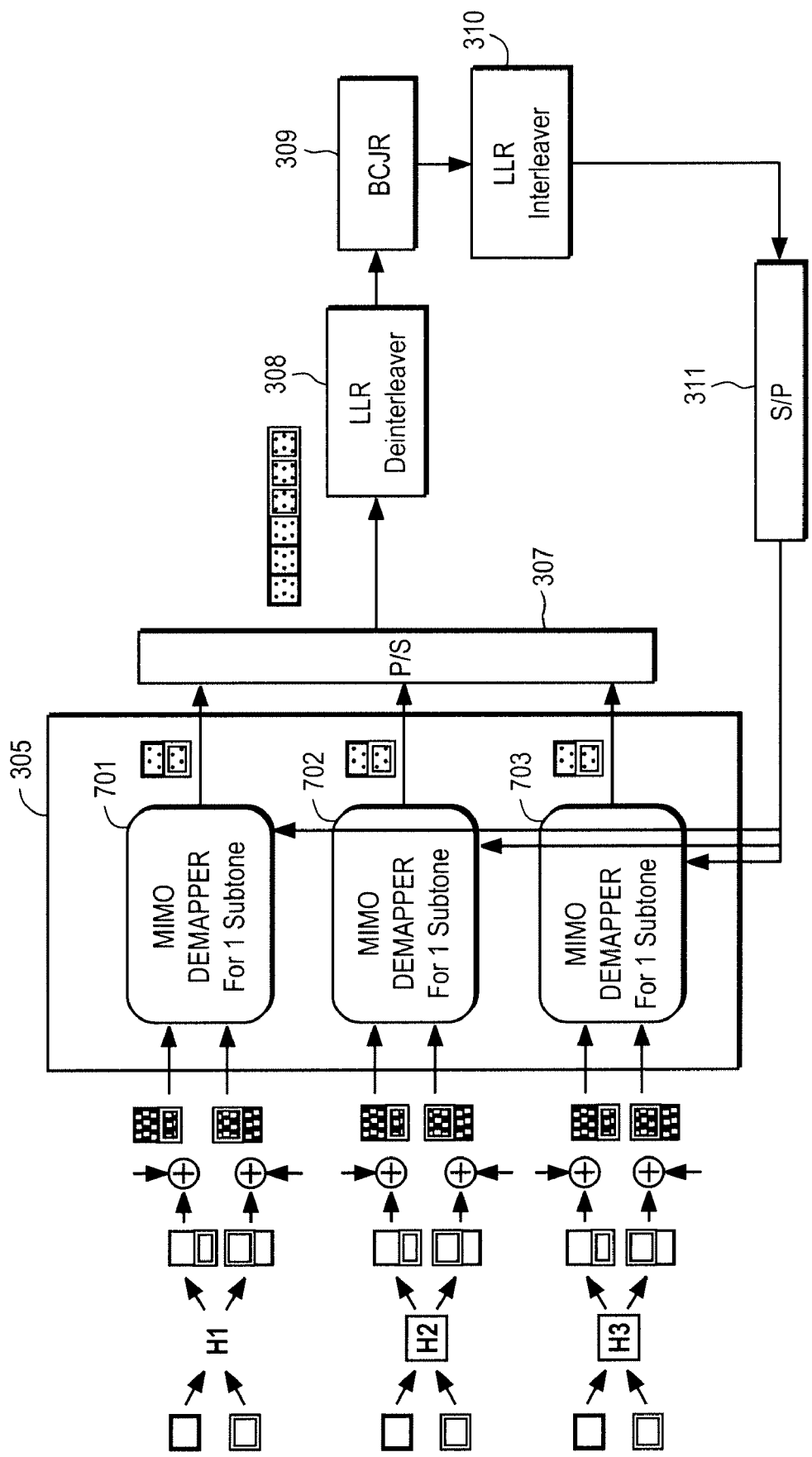
FIG. 7 illustrates another representation of the receiver of FIG. 3 in which each MIMO demapper for each tone is shown.

The MIMO demapper receives $y_1$ and $y_2$ signals and returns estimates of the bits represented by the symbols $s_1$ and $s_2$, for one subtone and reliability (soft) information on each bit representing each of the symbols $s_1$ and $s_2$. That is, soft-output (reliability information) is provided on the set of estimated bits. FIG. 7 illustrates another representation of the receiver of FIG. 3 in which each MIMO demapper for each subtone is shown.

After the QR-decomposition, two scalar measurements are obtained in the form described in equation (4). For illustration purposes, consider the permutation order $\pi$ corresponding to the order $s_1$, $s_2$. Due to the structure of the $L^\pi$ matrix in (4), the first measurement in $\tilde{y}$ only depends on $s_1$ while the second depends on both $s_1$ and $s_2$. Next, the metric in equation (6) is considered, which in this case is a sum of two terms. The first term (m=1) is the term due to the first measurement in $\tilde{y}$ and only depends on $s_1$. The second term (m=N=2) is term due to the second measurement (and consists of an $l_{12}$ and an $l_{22}$ term). This structure allows the computation of each of the metrics in (6) to be performed on a tree. At the first level of the tree only the first terms (m=1) in the sums in (6) are computed. Since these depend only on $s_1$ the number of terms computed (and thus number of level-1 nodes in the tree) equals the number of possible values $s_1$ can take. In the second step, from each node at level one (each corresponding to a distinct value of $s_1$), leafs for each possible value of $s_2$ are extended, and the second term (branch metric) in the sum in equation (6) is computed and added to $1^{st}$ term corresponding to the particular value of $s_1$. In the end (level 2 in this case), there are as many end nodes as there are candidate vectors of symbols, and each node represents a computation of (6) for a specific vector symbol candidate. Those can thus be compared as in (5) to provide bit estimates and reliability information for all the bits represented by the QAM symbol vector.

Figure 8:
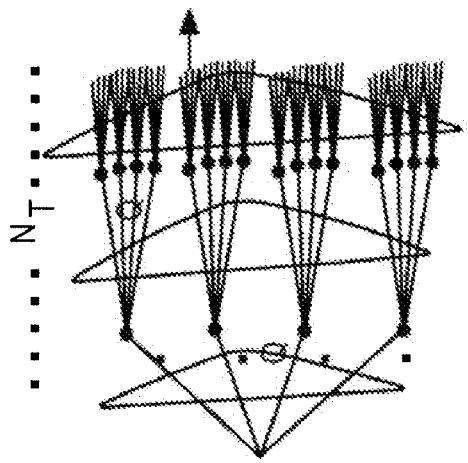
FIG. 8 illustrates the decision tree that allows a recursive computation of metrics on a tree in the case that there are three transmit antennas.
Figure 9:
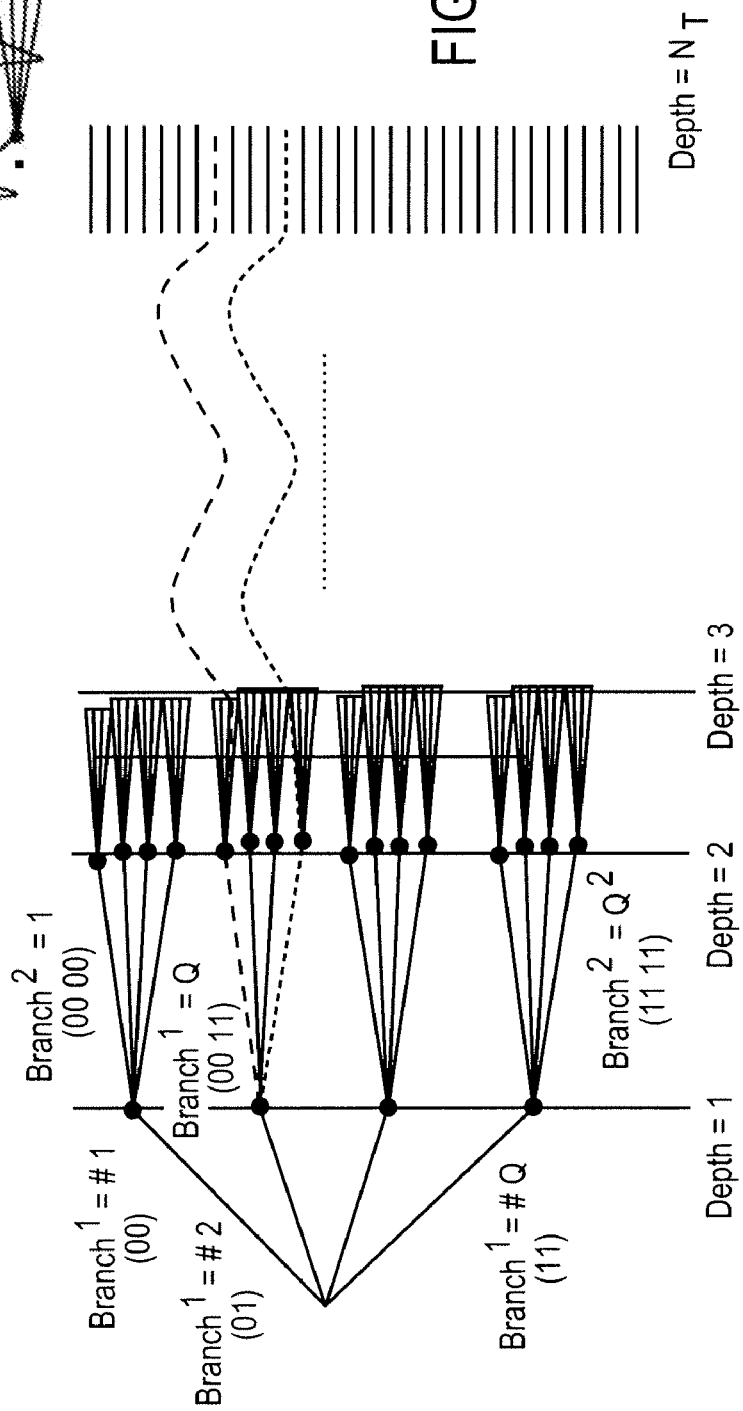
FIG. 9 illustrates an example of a decision tree.

FIG. 8 illustrates the decision tree that allows this recursive computation of metrics on a tree in the case that there are three transmit antennas and thus $N_t=N_r=N=3$. The SOMA algorithm does not search the full tree, but rather a limited set of paths. The way the paths are limited is to start expanding paths from the root of the tree and at each level keeping only a subset of the paths as surviving paths (i.e., as paths that will be further extended). Referring to FIG. 8, at each new level of the tree, a decision is made to expand the tree for only the M best branches. This decision can be based by calculating the partial distance metric for each candidate. Specifically, at level "n", the distance metric used for comparisons corresponds to the first "n" terms of equation (6) (i.e., the sum of all terms in equation (6) for m=1, 2, . . . , "n"). Then based on this metric the best M metrics are selected as survivors. Thus, the tree is pruned at each depth by keeping only the best M paths. This is represented in FIG. 9.

More specifically with respect to the searching the tree, the SOMA operates its search on a tree that is associated with a specific symbol order. The full tree without pruning represents all possible combinations of sequences of QAM symbols where the length of the sequences (or the depth of the tree) is equal to the number of transmit antennas. Let L denote the number of possible values of a single QAM symbol ($L=2^B$). At depth one in the tree, there are L candidates each corresponding to the L values associated with "so-called" ordered $1^{st}$ symbol. At the next depth, L candidates are expanded from each of the candidates of level 1, each candidate corresponding to the L values associated with "so-called" ordered $2^{nd}$ QAM symbol, and so on, until level N, in which case all symbol values for all N transmitted QAM symbols (on the given OFDM tone) have been represented. For example, for a 6×6 MIMO antenna system with 64QAM, the length of the sequences is 6 QAM symbols. The SOMA prunes the tree in decoding and only searches the most promising part of the tree according to a metric at each level.

When applying SOMA on a specific OFDM tone, there are N measurements (as many as there are receive and transmit antennas) and N QAM symbols that need to be resolved (these are the symbols transmitted on this OFDM tone over the N transmit antennas). In one embodiment, in order to apply the SOMA on a tree representing a specific symbol order, a preprocessing technique is applied on the N measurements, which is based on the well-known QR decomposition (performed by a QR decomposition front end of the joint demapper). The N-dimensional column vector representing all N measurements is projected to a unitary transformation. Specifically, the vector is left-multiplied by a matrix A that has dimensions N rows by N columns, and satisfies $AA^H=I$, where I is the identity matrix and the superscript,"$^H$" represents the transposition and element-wise conjugation operation. Any such unitary transformation of the measurements is invertible and therefore information preserving. As a result, the new processed N measurements, i.e., the result of the left multiplication of the original measurements, are information preserving. When the unitary matrix A is chosen based on the QR decomposition of the channel matrix, the resulting processed measurements have the following property: the first measurement only depends on the $1^{st}$ ordered symbol; the $2^{nd}$ measurement only depends on the $1^{st}$ and the $2^{nd}$ ordered symbols; the kth measurement depends only the first k ordered symbols. These processed measurements are then used to implement the SOMA algorithm on a tree with the specific symbol order. Note that to operate the SOMA on a tree formed by a different symbol order, a different unitary matrix A should be used. The new unitary transformation would then generate a different set of processed measurements, so that the kth measurement only depends on the k first symbols in the new symbol order.

In one embodiment, the decoding tree is organized based on reordering the symbols according to their received energy levels, or signal to noise ratio levels. In one embodiment, these received signal or SNR levels are estimated from the channel state information at the receiver, and potentially taking into account extrinsic information provided by the outer decoder. To compute the received symbol energy associated with the kth symbol (i.e., the QAM symbol transmitted by the kth transmit antenna), the receiver computes the total received channel-coefficient energy from the kth transmit antenna to all receive antennas. The symbol corresponding to the highest received energy level is placed at the root of the tree and is processed first in the decoding algorithm. The second symbol in the tree is ordered such that it has the second highest received energy level. The remaining symbols are selected according to decreasing received energy level values. This ranking yields better detection efficiency. Then, following the required QR decomposition, the SOMA in its simplest form can be operated with a fixed value of M, as well as fixed T and I parameters. In another embodiment, the signal energies of the symbols that are relevant during the tree search are instead used for ordering. First, all symbols are tested as the first symbols in the tree order and the symbol with the highest signal energy on the first-level tree is chosen. Then all remaining symbols are considered as the second symbol in the order, and the symbol with the highest signal level on the second level on the tree is chosen as the second symbol in the order. The process continues until all symbols have been ordered. In one embodiment, the signal energy on the tree of each of the symbols tested can be computed as follows. Assuming a symbol is considered as the "m"th ordered symbol at level m on the tree (after symbols 1, 2, . . . , m-1 in the order have already been selected). An order π is chosen, whereby the first m symbols are the given ordered symbols and where an arbitrary order is placed on the remaining symbols. Then the QR decomposition for that symbol order is performed and an equation of the form (4) is obtained. Then the magnitude of the "m"-th entry on the main diagonal of the matrix $L^{π}$ in Equation (4) denotes the signal-level on the "m"-th symbol in the tree. Note that only the magnitude of the "m"-th entry on the main diagonal is needed, and the value of that entry can be computed in computationally efficient manner, without performing the full QR decomposition. Specifically, consider selecting the "m"-th ordered symbol. In the described embodiment, the first m-1 symbols in the order have already been selected and all remaining symbols are compared as the "m"-th symbol in the order. For each of these symbols, a QR decomposition is made for a (symbol-specific) order π, according to which the first m-1 symbols are the already chosen symbols, the "m"-th symbol is the symbol in comparison, and the rest of the order is arbitrary. Consider a fixed but arbitrary row among the first m-1 rows of the matrix A in the QR decomposition. Any such row of the matrix A is the same for each of these QR decompositions that test symbols as the m-th ordered symbols. Also, only the "m"-th row of the A matrix associated with any such order π needs to be determined, in order to obtain the required SNR information, i.e., in order to obtain the "m"-th element along the main diagonal of the matrix $L^{90}$ in Eqn. (4). This can be computed quite efficiently in a manner well known in the art.

Note that, as described above, the symbol ordering for setting up the SOMA search tree is conducted on a per-tone basis, i.e., the ordering is performed independently for every tone in the OFDM system. In principle, however, this is not required. In another embodiment, other block-reordering schemes are used in which the same tree-search order is chosen for a block of tones by comparisons of the received symbol levels over the given block of tones.

The tree-search symbol reordering technique has a number of advantages. One advantage is that it provides a method for a high performing inner joint demapper with soft output, with an overall complexity that makes it implementable in an iterative decoding setting. Furthermore, tree ordering requires minimal additional complexity, and can yield improved performance for the same complexity, or allow achieving the same bit-error-rate performance with lower receiver complexity.

The SOMA detection process also calculates the soft (reliability) information on each bit, besides choosing the best path as described herein.

Figure 10:
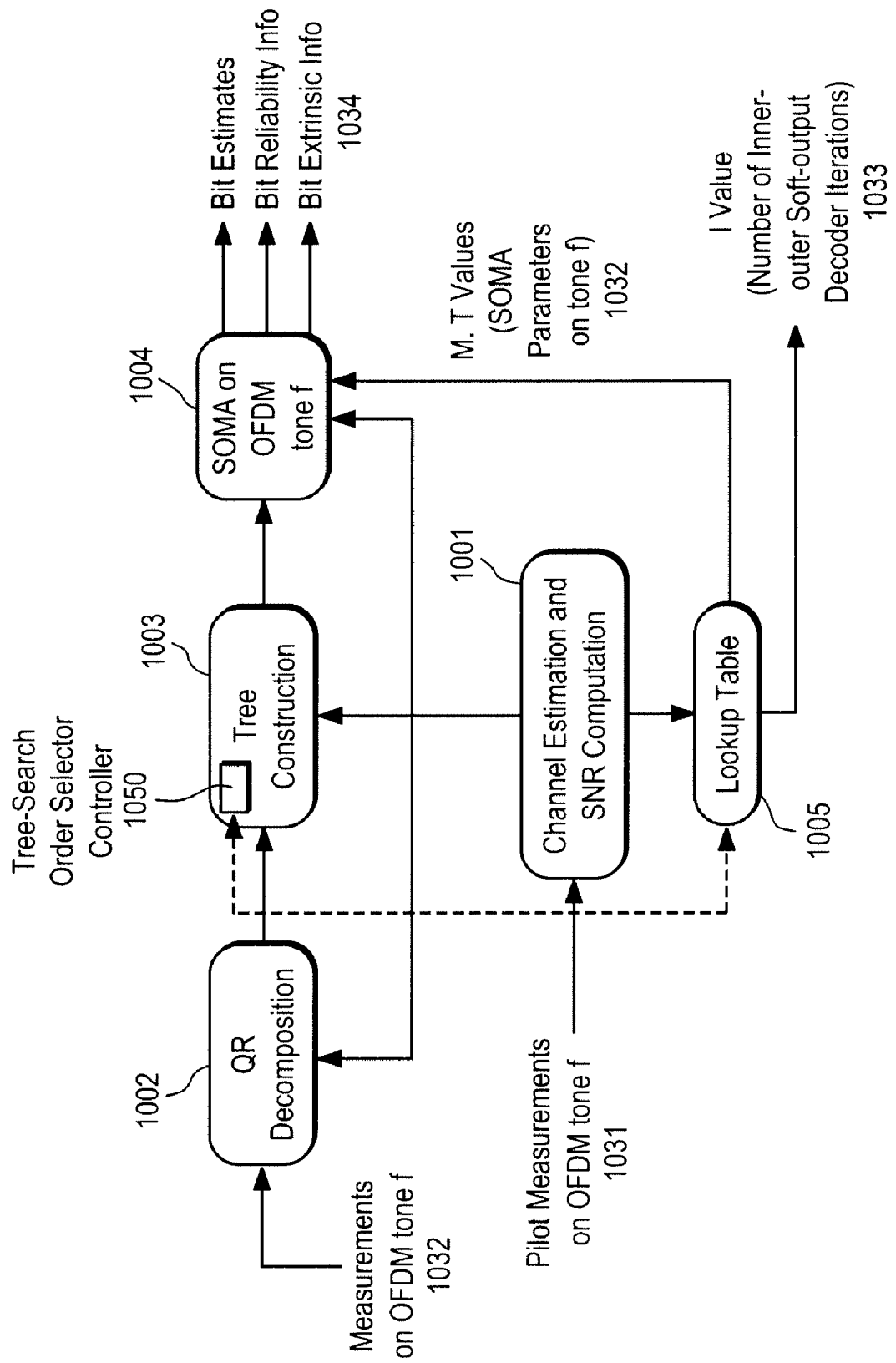
FIG. 10 is a flow diagram of one embodiment of a process for setting up the SOMA inner decoding operation on a tone.

In one embodiment, the complexity of the inner SOMA decoder is controlled by the values of the parameters M (the number of best paths) and T (the early-terminated paths). The overall complexity is also controlled by the number of times the inner decoding algorithm is used, which, in turn, is determined by the number of OFDM tones and the number of iterations (I) used for iterative decoding. FIG. 10 is a flow diagram of one embodiment of a process for setting up the SOMA inner decoding operation on tone f. The process is performed by processing logic that may comprise hardware (e.g., circuitry, dedicated logic, etc.), software (such as is run on a general purpose computer system or a dedicated machine), or a combination of both. The process is performed on each tone.

Referring to FIG. 10, first channel measurements are used (based on pilot signals) to estimate the channels between all transmit-receive antenna pairs on any given tone f (this would correspond to estimating the channel matrix H[f]) (1001).

The channel estimation and SNR computation are based on pilot measurements on OFDM tone f (1031). The channel estimates and lookup table (LUT) 1005 are used to set up the adaptivity (e.g., changing the tree-search symbol order, changing M, T of the I, etc.) of SOMA.

More specifically, these measurements are used to set up the QR-decomposition of the channel matrix, set up the SOMA detection tree (1003) using tree-search symbol order selector/controller 1050 (optional), and select (e.g., by use of a lookup table) the parameters of the SOMA algorithm (1004). As the flow diagram reveals, the selection of these parameters depends on the channel conditions. Then, once the QR-decomposition (1002), detection tree (1003), and SOMA parameters have been set (1004), the measured data on all receive antennas on tone f (1032) are processed through a QR-decomposition (1002) to generate a set of effective channel measurements, the tree is constructed (1003) and then the SOMA inner detection algorithm is implemented (1004).

In one embodiment, the receiver performs a modified soft output M-algorithm (SOMA) that is used adaptively with a forward-backward tree search. The base SOMA operates only in the forward direction, where at each level the locally best path is recursively estimated and then the bit reliability values are recursively estimated based on the locally best path and taking into account the terminated paths at that level of the tree. As a result, the reliability information for each bit is not necessarily gathered with respect to the full-length path and the associated longest early-terminated path. In contrast, the SOMA process described herein is the FB-SOMA, which is a two-pass version of the soft-output M-algorithm that has a forward pass followed by a backward pass.

Figure 13:
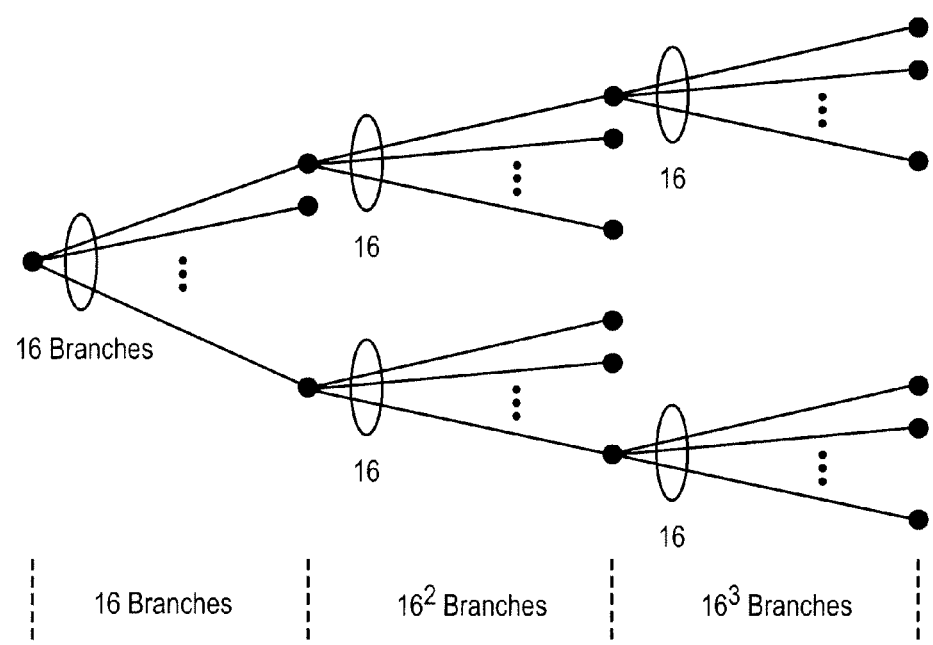
FIG. 13 illustrates a conventional 3-level tree for N=3 transmit antennas and 16 QAM.

The FB-SOMA algorithm will be described with respect to the regular tree, such as shown in FIG. 13, which illustrates the conventional tree for the basic SOMA and the basic FB-SOMA. In the forward direction, the M-algorithm is first performed. The paths are calculated and sorted at each depth level of the tree and all early-terminated paths are stored with their path metric values. The best M paths are expanded to the next level and the terminated paths at that level are stored after calculation and sorting the paths at each depth level. Note that this is in contrast to the basic M-algorithm where the terminated paths are discarded and to the basic SOMA where the estimated reliability values are calculated recursively during the forward direction (which is the only direction in basic SOMA). When the forward pass reaches the end of the tree, the M best sequences (paths) are obtained together with a total of M times (Q-1) terminated paths at the final depth of the tree. The best length-N path (out of the MQ length-N paths), referred to as the AML path, is used to estimate the overall best sequence of Nb bit estimates. The bit reliability values for the bits in the best path are estimated in the backward pass.

In the backward pass, initially, the B likelihood differences associated with the bits in the last branch are calculated. For any one of these bits, its reliability is calculated as the path metric difference between the AML path and the best length-N path (out of the MQ calculated ones) that disagrees with the estimate provided by the AML path for that bit location. Therefore, if there are two or more paths that disagree with the estimate provide by the AML path for that bit location, the longest one is used. Some of the earlier bits can also obtain reliability values based on this process. In particular, this process is also applied to all the other bits for which a length-N path exists (in the set of MQ length-N paths) with a bit estimate that is different from that provided by the ML path at that bit location. Then, the backward pass processing continues to move to the preceding level (depth) of the tree and continues the same process of computing relative reliability values for as many of the remaining bit locations as possible based on the set of "M times (Q-1)" remaining (early terminated) candidates at that depth. Eventually, all the bit reliability values for all the bits in the best path are found based on the longest available competing sequence.

The forward-backward SOMA is a two-stage soft-output process. In contrast to the conventional SOMA, which recursively computes soft-output (bit-LLR values) during the single forward pass through the detection tree, the forward-backward SOMA delays the computation of the bit-LLRs until the second, backward, pass. In one embodiment of the forward-backward SOMA, the outputs of the forward pass of the algorithm are the following: 1) the best full-length path visited by the underlying hard-output M algorithm, along with all its partial path metrics (lengthen metrics, with n=1, 2, . . . , N); 2) a table with one entry per bit location, where the entry for a given bit location represents the depth at which the bit-LLR will be computed for that bit location; 3) a table with one entry per bit location, where the entry for a given bit location represents the alternative bit-value metric to be used in the bit-LLR computation for that bit location. This information is sufficient to obtain the bit-LLRs for all bits in the subsequent backward stage of the process, as described in the following text.

The outputs of the SOMA inner detection algorithm are bit estimates, bit reliability information and bit extrinsic information 1034. The hard output is generated thereafter, in a manner well known in the art, based on the best path.

In one embodiment, the SOMA is implemented on OFDM tone f using SOMA parameters on tone f provided by LUT 1005. The output of LUT 1005 may provide one or more variable values of the SOMA parameters on tone f, namely M, T (1032), and the number of inner-outer soft-output decoder iterations, namely I (1033). That is, LUT 1005 may specify the value of M (when M is adaptive) while the values of T and I are unchanged (non-adaptable), or the value of T (where T is adaptable) while the value of M and I are unchanged (non-adaptable). The same could occur for 2 or more of the values of M, T and I. These values may be changed at different depths/levels of the tree, such that adaptation occurs over different levels. In such a case, adaptation occurs based on tone quality and on depth. In an alternative embodiment, a LUT is not used and the values are changed in the SOMA algorithm itself. In such a case, in one embodiment, the values are thresholded in the algorithm. For example, if the channel estimate for the tone falls within a first range, a certain value of M is used (e.g., M=8), but if the channel estimate of the tone falls in another range, then a different value of M is used (e.g., M=12). These changes in value may also be based on the number of transmit antennas, the rate of the outer binary code, etc. Note that certain values may change based on whether the group of the paths with the best metrics have metrics that are clustered together, such that those in the cluster (more or less than M) or having values within a certain percentage of the worst metric in the cluster (e.g., with 95% of the value of the lowest quality metric in the cluster) are permitted to continue to the next level/depth in the tree. The resulting set of survivors may have cardinality more or less than M. Alternatively, the process may keep as survivor paths, all the paths whose relative metrics are within a certain percentage (e.g., 95%) of the metric of the best path.

In one embodiment, tree search order selector controller 1050 and LUT 1005 exchange information. For example, tree search order selector controller 1050 selects an order but it also specifies a decomposition of the form of equation (4) that is used to set up the tree. The SNR values at level m on the tree are given by the m-th row of the L matrix in equation (4). These SNR values can be also used to choose via the LUT 1005 values for e.g., the M parameter at each level of the tree.

Figure 11A:
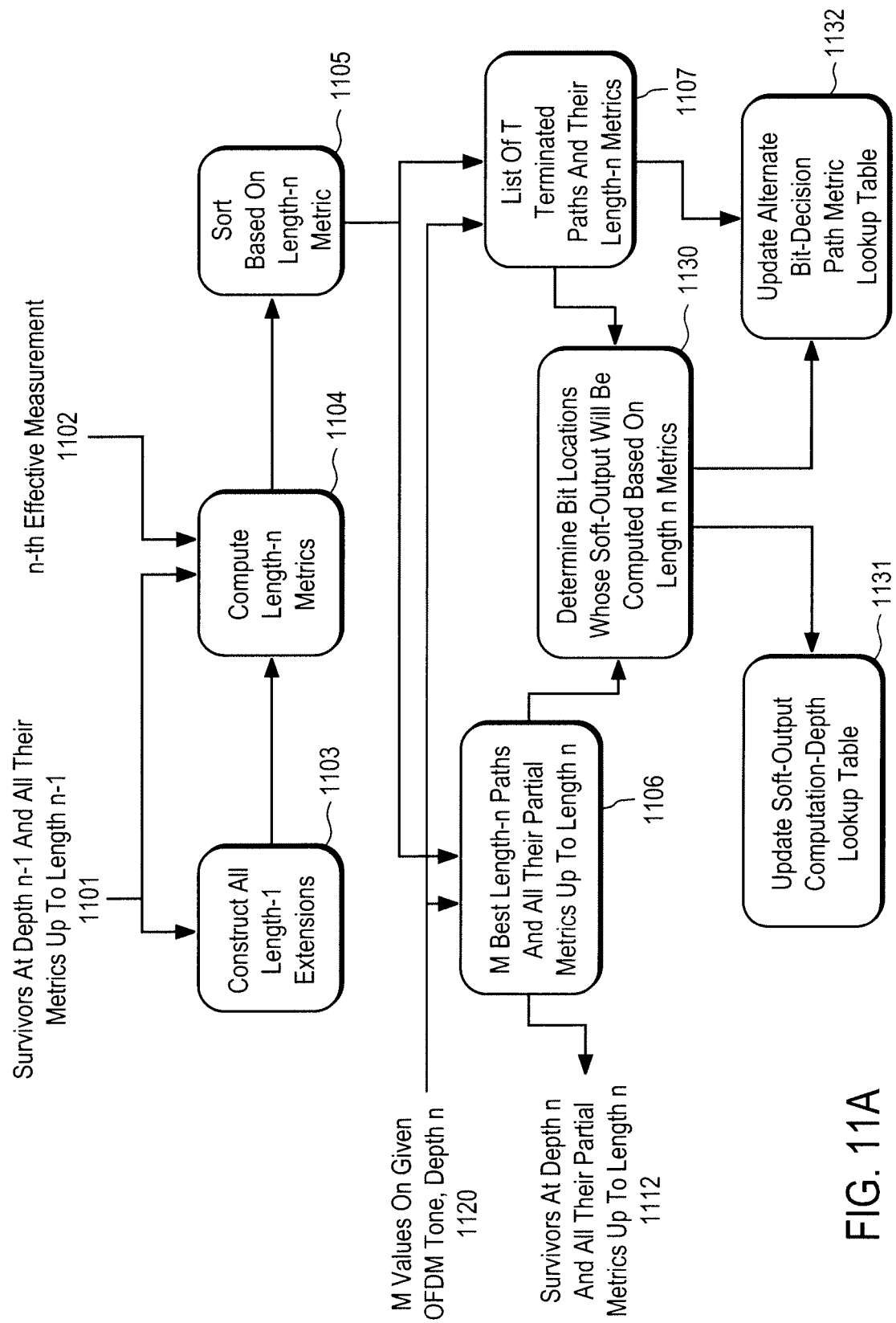
FIG. 11A is a flow diagram of the forward pass of the forward-backward SOMA detection process at a particular depth.
Figure 11B:
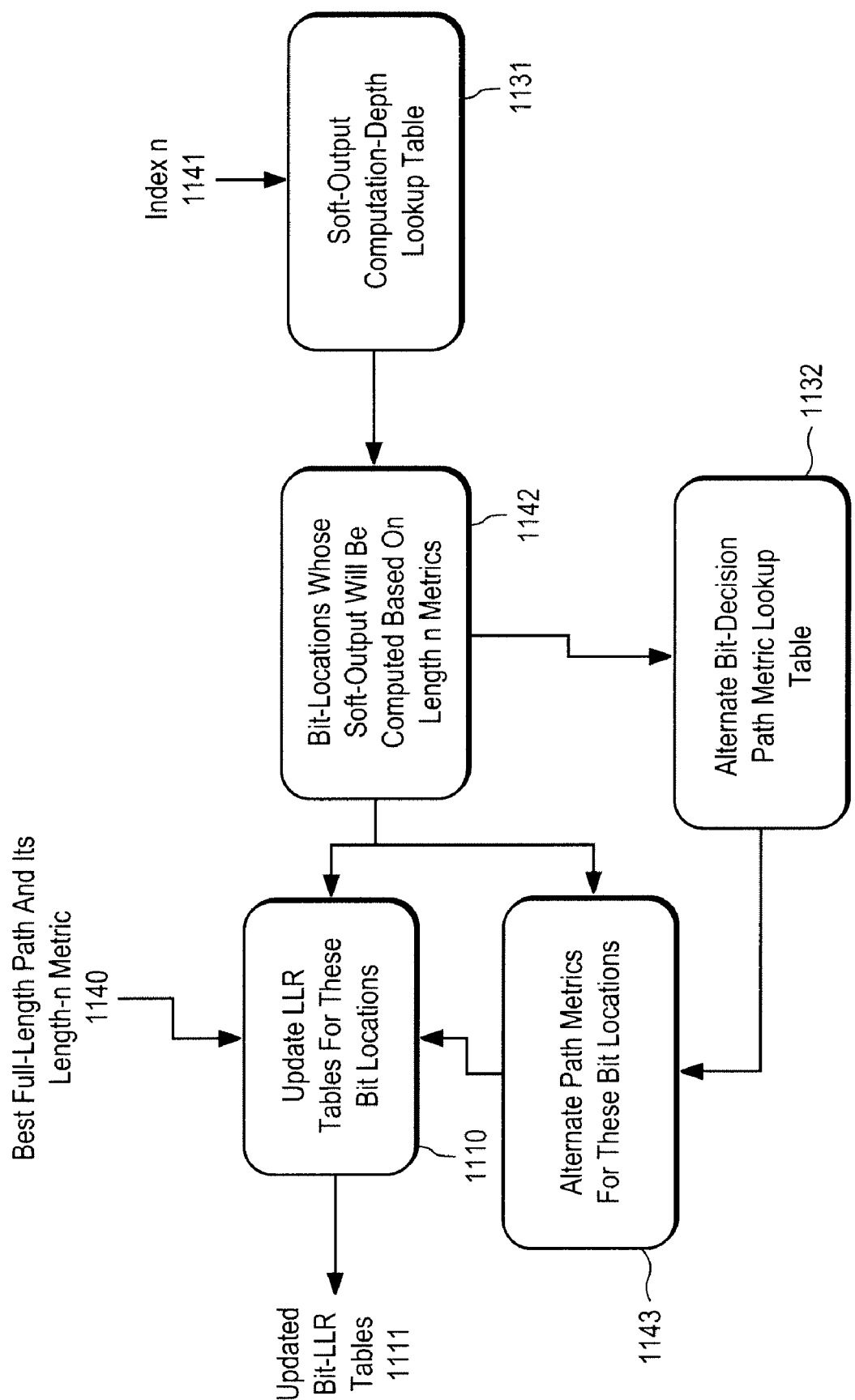
FIG. 11B is a flow diagram of the backward pass of the forward-backward SOMA detection process at a particular depth.

A flow diagram of the forward and the backward passes of the forward-backward SOMA detection process at depth n are shown in FIGS. 11A and 11B, respectively. These processes are performed by processing logic that may comprise hardware (e.g., circuitry, dedicated logic, etc.), software (such as is run on a general purpose computer system or a dedicated machine), or a combination of both.

Referring to FIG. 11A, the main input is the set of survivors at depth n-1 and all partial metrics of length 1, 2, . . . , n-1 of these survivor paths (1101). First, all the possible length-1 extensions of each of these length-"n-1" paths are constructed based on the survivors of the previous depth and their metrics (1101) to generate the set of all length-n paths that will be visited by the algorithm. Then the survivor metrics at depth n-1 (1101) and the effective measurement at depth n (1102) are used to compute the length-n metrics (1104) of these length n paths that are constructed at 1103. The paths are then sorted based on their length-n metric quality (1105). The list produced in 1105 together with M are used as inputs to produce the list of best M paths in 1106 and the list of remaining early-terminated paths in 1107. The M paths with the best metrics are chosen as survivors at depth n (1112), in the same manner as the well-known M-algorithm process. The partial metrics of length 1, 2, . . . , n, are also computed (1106), and produced as an output of the forward pass at depth n. The rest of the paths (i.e, all the paths from the list produced in 1105 that are not survivors) are put in the list of the paths that are terminated (1107). The binary sequences (each of length Bn) represented by the M survivors (1106) are compared against the binary sequences in the list 1107, in order to determine all the bit locations (from location 1 to location Bn) at which all survivors agree in bit-value, while at the same time there are candidates with the alternative bit-value in the list of sequences in 1107. For these bit locations, soft output (bit-LLR) will be computed at depth n (in the backward pass of the process). These bit locations are determined in 1130. The soft-output computation-depth lookup table contains NB entries, one for each bit-location in the full-length sequence. The entry associated with a particular bit location represents the depth at which soft-output is to be computed at the particular bit location. The output of module 1130 is used to update this table (1131). The alternate bit-decision path metric lookup table contains one entry per bit location (a total of NB entries). The entry associated with a bit location "J" is the path metric for the alternative bit-value used in calculating the bit-LLR for bit J. Let "J" represent an arbitrary but fixed bit location that was selected at module 1130 to be updated at length n. Then the path metric stored in location "J" of the alternate bit-decision path metric lookup table is the metric of the best terminated sequence (1107) with bit value at the "J" location that differs for the bit value of the surviving paths (which of course agree at the "J" bit location). Module 1132 performs this lookup table update at depth n. It is important to note that in the forward-backward SOMA (without loss of generality) the M value at full length is set to M=1. At full length, the output 1112 of the process is then simply the best full-length survivor path along with all its partial metrics. Available as inputs to the backward pass are the two lookup tables 1131 and 1132. The backward pass of the process goes through all depths from depth n=N to depth n=1, and generates systematically bit-LLR values for all bit locations as shown in FIG. 11B. In particular, at depth n, the inputs to the process are the metric of the length-n partial path from the best full-length path (1140), the index n (1141) and the two lookup tables (1131 and 1132) generated as outputs of the forward pass. First a reverse table lookup is performed from table 1131 to determine the set of bit locations whose soft-output will be computed based on length n metrics (1142). For each of these bit locations, the alternative bit-value metric is fetched (1143) from lookup table 1132. These metrics are subtracted from the length-n metric of the best full-length path (1140) and the result is used to update the bit-LLR values for these bit locations (1110). The output is the updated bit-LLR tables (1111).

Alternative Embodiments

In another embodiment, the FB-SOMA is run based on approximate metric values (at least for some of the paths) for calculating and sorting. In one embodiment, the calculating and sorting is performed using the method described in K. Higuchi, et al., "Adaptive Selection of Surviving Symbol Replica Candidates Based on Maximum Reliability in QRM-MLD for OFDM MIMO Multiplexing," in Proc. Globecom, December 2004, pp. 2480-2486. This yields further savings in computational complexity.

Figure 14:
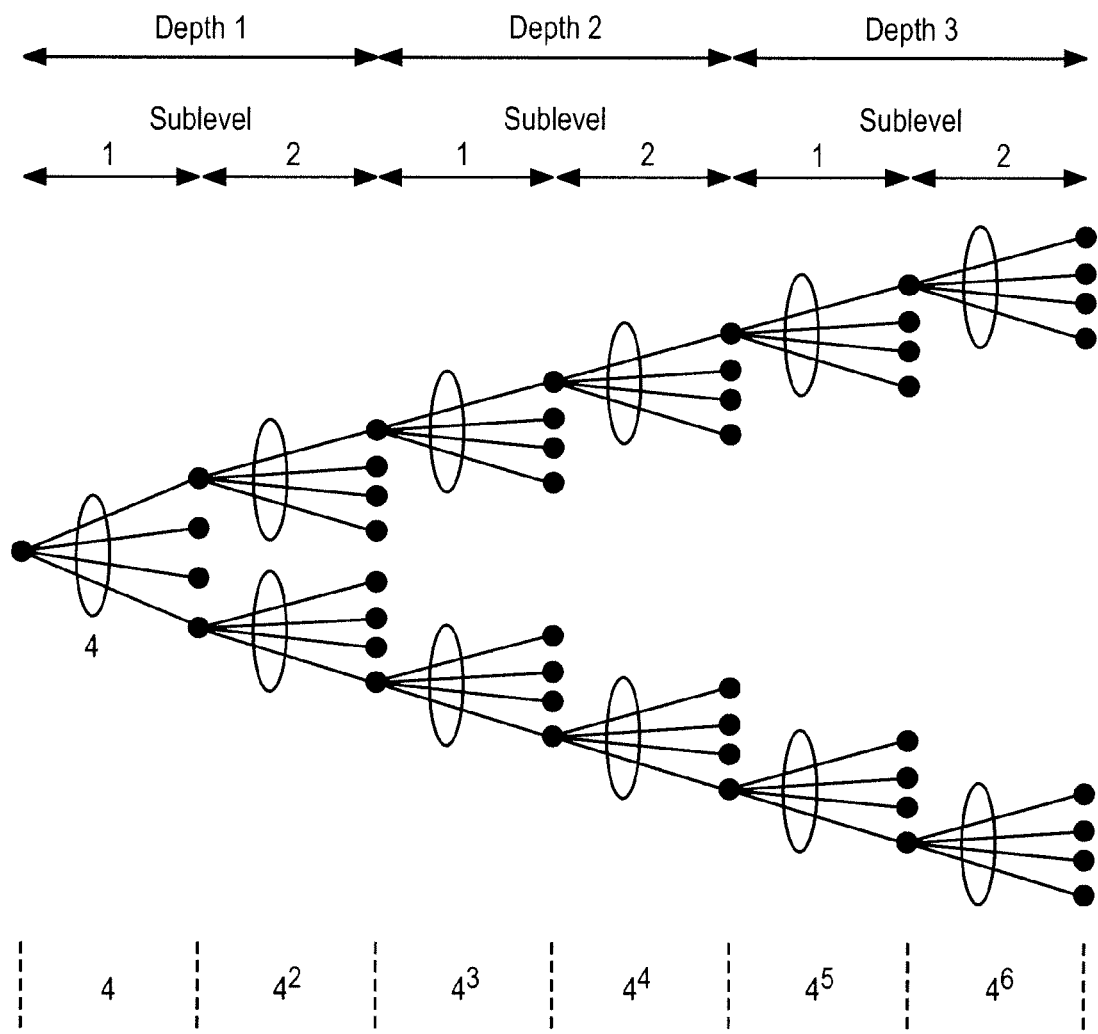
FIG. 14 illustrates a hierarchical tree associated with the conventional tree in FIG. 13, employing two sub-levels, with 2 bits each.

In yet another embodiment, the FB-SOMA is combined with the hierarchical tree based SOMA, the H-SOMA, which is well-known in the art (See Kitty Wong, cited herein). FIG. 14 illustrates the associated hierarchical tree for the H-SOMA, which can also be employed with the FB-SOMA. The hierarchical SOMA (H-SOMA) only works with the Gray mapper. As shown in Kitty Wong, "The Soft Output M-algorithm and its applications," PhD Thesis, Queens University, Kingston, Canada, August 2006, the H-SOMA uses a sub-tree representation of each $2^B$-QAM symbol that consists of a number of shorter branches representing a single B-bit branch. This hierarchical tree leads to a reduced workload for the conventional SOMA as well as the forward-backward SOMA, especially, for large B values. The use of the hierarchical tree can yield significant savings for the base SOMA, in particular, for large QAM constellations, like 64 QAM. The same relative savings are also obtained by the FB-SOMA on the hierarchical tree.

The backward pass does not have to be implemented by tracing the detection tree backwards. For example, at the second stage of the algorithm (i.e., once the forward pass is complete), the process in FIG. 11B is implemented starting with n=1, and incrementing n by one until n=N (full length) is reached. The effect is that of running a second forward pass. However, the result of the computation is identical to that of the already described forward-backward SOMA. Many other variations are possible all yielding identical results. Note that there may exist depths at which soft-output is not computed for any bit location. In such a case, the second stage of the process need not be executed for such depths.

In one embodiment, the FB SOMA is varied to become a Serial SOMA based on a two forward pass method. In one embodiment, the first forward step is identical to that of the FB-SOMA described above. Then, with the knowledge of the best path, the likelihood values for all the bits are calculated relative to the best path in a second forward step, with comparisons against stored path metrics of early-terminated paths. In another embodiment of a two-pass algorithm, the first forward step is identical to that of a hard-M algorithm and is used to identify the best full-length path. Then, with the knowledge of the best path, the likelihood values for all the bits are calculated relative to the best path in a second forward pass. In this case, however, these likelihood values are computed recursively during a second forward pass through the tree, with comparisons between newly calculated path metrics of early terminated paths and the associated shortened metric of the (known) best full-length path.

Other Adaptive Embodiments

In one embodiment, the adaptive SOMA receivers can be additionally adapted in other ways as well (e.g., SOMA algorithms that have variable M in the tree and adapt the M, I, T parameters to the quality of the OFDM tones). One embodiment of the invention can be used independently or optionally be combined with those adaptation methods.

In another embodiment, the SOMA-based MIMO detection process is adapted based on the number of early-terminated paths in the tree (T), which are used in soft-output value calculations. In another embodiment, the SOMA-based MIMO detection process is adapted based on the number of iterations for each tone based on tone quality. In yet another embodiment, the SOMA-based MIMO detection process is adapted during each iteration and for every tone based on tone quality. In another embodiment, the SOMA-based MIMO detection process adapts one or more of the parameters, a number of early-terminated paths in the tree, and a total number of iterations based on tone quality.

In one embodiment, the different SOMA detectors are used for the different tones and are selected adaptively based on the quality of the tones. For a tone with good quality (high signal level, or high SNR), the M-value can be lowered and/or the T-value can be lowered and/or the I value can be lowered. The range of values for M and T vary as a function of number of transmit streams (number of transmit antennas) N, the size of the QAM constellation employed and the rate of the outer code in the system. As an example, based on experiments in 4 by 4 16 QAM MIMO, M=16 suffices to get near optimal performance. However, this value increases with increasing number of streams and QAM constellations. Typically, a (pre-computed) lookup table can be employed that lists the value of M (and T) that should be used for set of SNR (or signal level) ranges. This approach yields lower relative complexity for that particular SOMA detector. On the other hand, for a tone (OFDM subchannel) of poor quality (low signal level or low SNR), higher values will be chosen for all or a subset of M and T and I. One approach for instance corresponds to setting a target performance in bit-error-rate at the mobile (this can be preset by the application). In this case, the higher the SNR on the tone, the lower the value of M needed to achieve the desired performance. As the SNR is reduced, the opposite effect takes place. However, there is an SNR level such that lowering the receive SNR beyond that value makes it impossible to achieve the desired performance at the mobile (no matter what the complexity). Beyond that level, either the maximum allowable value of M is used or the event is declared in outage. This leads to a higher value of complexity for this particular tone. The adaptive use of the SOMA and the number of iterations saves complexity without reduced performance. For the non-adaptive case the performance will, to a large extent, be dictated by the worst-quality tone, which corresponds to the highest relative complexity for the SOMA detectors.

In another embodiment, a metric correction term is applied for the soft output algorithm, much the same as the one used in the corrected SOVA algorithm. See, for example, Kitty Wong, "The Soft Output M-algorithm and its applications," PhD Thesis, Queens University, Kingston, Canada, August 2006.

In yet another embodiment, the mapper type is a set partition type mapper rather than a Gray mapper for the QAM constellations.

Advantages of Embodiments of the Invention

One advantage of one embodiment of the invention is that it provides for a high performing inner joint demapper with soft output, and an overall complexity that makes it implementable in an iterative decoding setting. Subject to M-algorithm based reduced-complexity algorithms, the FB-SOMA provides a reliability estimate for each bit based on comparing the two longest and best available sequences with values 0 and 1 on that bit. The calculations are efficient, especially when approximate metric and sorting calculations are used. Furthermore, one embodiment of the invention can easily be combined with tree ordering which requires minimal additional complexity, and can yield improved performance for the same complexity, or allow achieving the same bit-error-rate performance with lower receiver complexity. Hierarchical FB-SOMAs can also be used with constructions similar to the hierarchical SOMAs, when mappers with the multilevel bit property are employed.

In one embodiment, elements that make a two-pass receiver schemes described above are:
1. An OFDM based system with one MIMO detector for each tone, where the complexity reduction in the FB-SOMA based detector is implemented adaptively for each tone by use of symbol reordering followed by a SOMA-based decoder. The reordering process is based on CSI that is collected at the receiver regardless of whether or not tree reordering is performed.
2. The FB-SOMA decoder employed over each tone can be fixed (using fixed M, I, T parameters) or it can be channel adaptive.
3. The M value used in the FB-SOMA tree may be fixed or it may vary over the decoding tree.
4. A maxlogMAP metric can be employed by the FB-SOMA.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A receiver for use in a wireless communication system to receive information-bearing signals from a transmitter wirelessly transmitted using OFDM and bit interleaved coded modulation, the receiver comprising:
an inner decoder structure having a soft output M-algorithm (SOMA) based multiple-in multiple-out (MIMO) joint demapper that uses a SOMA-based MIMO detection process to perform joint inner demapping over each tone, the SOMA-based MIMO joint demapper being operable to identify a best candidate among a number of candidates by searching a detection tree for each tone using a forward pass through the detection tree, where only a number of best alternatives from every level of the tree are expanded and where soft-output related information is collected and stored, and to perform a second pass on the detection tree following the forward pass during which soft-output is computed for each bit using information collected and stored during the first pass, wherein for the forward pass, at each depth of the detection tree, opposite decisionpartial metrics are saved for only a portion of the bits based on early terminated paths and all partial metrics are saved for survivors, where the partial metrics include the longest possible and best available paths, and
an outer decoder operable with the SOMA-based inner decoder to perform iterative decoding.

2. The receiver defined in claim 1 wherein the SOMA-based inner decoder only computes soft-output information as part of the backward pass being made through the SOMA tree.

3. The receiver defined in claim 1 wherein the SOMA-based inner decoder prunes the SOMA tree at each level by keeping on the best M paths and calculates soft information for each bit based on partial length metrics of the best full-length path and best and longest path with an opposite decision value.

4. The receiver defined in claim 1 wherein the forward pass includes
storing less than all early terminated paths and their metrics and all the partial paths associated with the M survivors, and
obtaining a best full-length path through the SOMA tree in obtaining the hard bit estimates; and
further wherein the backward pass includes computing bit-LLR estimates by traversing the tree backwards.

5. The receiver defined in claim 4 wherein the soft-output information is collected only in the backward pass.

6. The receiver defined in claim 4 wherein computing the bit-LLR estimates is performed using the best full-length path and the longest and best visited path with the opposite decision on the bit of interest.

7. The receiver defined in claim 1 wherein the soft output information on a bit is computed as the difference between a metric of the best visited full-length codeword and a metric of the longest alternative decision path visited, where the longest alternative decision path visited is the best visited path with a different decision on a given bit from that of the best visited full-length path.

8. The receiver defined in claim 1 wherein the best full-length path is computed at the end of the forward pass.

9. The receiver defined in claim 1 wherein searching the detection tree is performed using a tree-search symbol order that is adapted for each tone based on channel state information and extrinsic information from the outer decoder.

10. The receiver defined in claim 9 wherein the channel state information comprises estimated received symbol energy with the symbol with the highest symbol energy being at the root of the tree, the symbol with the next highest energy being next in the tree, and with the remaining symbols being in the tree according to decreasing energy levels.

11. The receiver defined in claim 9 wherein the tree-search symbol order is based on the signal levels or SNRs of the symbols on the tree.

12. The receiver defined in claim 1 further comprising a soft-in soft-out (SISO) decoder to use the soft output values from the inner SOMA-based MIMO joint demapper to produce output data, wherein the SISO decoder feeds soft values back to the inner decoder structure for iterative decoding.

13. The receiver defined in claim 1 wherein the forward pass outputs a best full-length path visited by the M-algorithm along with partial-path metrics, a table with an entry for a given bit location representing a depth at which the bit-LLR will be computed for that bit location, and a table with one entry per bit location representing an alternative bit-value metric for use in bit-LLR computation for that bit location.

14. The receiver defined in claim 13 wherein the second pass obtains bit-LLRs for bits.

15. A receiver for use in a wireless communication system to receive information-bearing signals from a transmitter wirelessly transmitted using OFDM and bit interleaved coded modulation, the receiver comprising:
an inner decoder structure having a soft output M-algorithm (SOMA) based multiple-in multiple-out (MIMO)

joint demapper that uses a SOMA-based MIMO detection process to perform joint inner demapping over each tone, the SOMA-based MIMO joint demapper being operable to identify a best candidate among a number of candidates by searching a detection tree for each tone using a forward pass through the detection tree, where only a number of best alternatives from every level of the tree are expanded and where soft-output related information is collected and stored, and to perform a second pass on the detection tree following the forward pass during which soft-output is computed for each bit using information collected and stored during the first pass, wherein the second pass comprises determining the set of bit locations whose soft-output will be computed based on length metrics at a certain depth level, obtaining an alternative bit-value metric for each of set of bit locations, subtracting the obtained metrics from the length metrics of the best full-length path, and updating the bit-LLR values for each bit locations based on results of the subtraction, and an outer decoder operable with the SOMA-based inner decoder to perform iterative decoding.

16. The receiver defined in claim 1 wherein the SOMA-based MIMO detection process is adaptable based on number of iterations for each tone based on tone quality.

17. The receiver defined in claim 1 wherein the SOMA-based MIMO detection process is adaptable during each iteration and for every tone based on tone quality.

18. The receiver defined in claim 1 further comprising:
a plurality of antennas; and
a plurality of fast Fourier transform (FFT) modules, each of the plurality of FFT modules coupled to receive signals from one of the plurality of antennas.

19. The receiver defined in claim 1 wherein the outer decoder is one of a group consisting of a MAP decoder, a MaxLogMAP decoder, and a turbo-type decoder, each for an encoder that comprises a binary outer code from a group consisting of a convolutional code, a rate-compatible punctured convolutional (RCPC) code, a turbo code and an LDPC code.

20. A method comprising:
performing a first decoding operation to produce a first set of output data representing most likely transmitted bit estimation values and information about the reliability of each of these estimates, including
performing a SOMA-based MIMO detection process over each tone for joint inner demapping, by identifying a best candidate among a number of candidates by searching a detection tree for each tone using a forward pass through the detection tree, where only a number of best alternatives from every level of the tree are expanded and where soft-output related information is collected and stored during the first pass; and
calculating a soft output value for each bit after the first pass and responsive to a second pass on the detection tree and using the information collected and stored during the first pass, by comparing an estimated best path with the longest and best visited path with an opposite decision on the bit, wherein for the forward pass, at each depth of the detection tree, opposite decision partial metrics are saved for only a portion of the bits based on early terminated paths and all partial metrics are saved for survivors, where the partial metrics include the longest possible and best available paths.

21. The method defined in claim 20 wherein calculating a soft output value for each bit comprises calculating a soft output value for each bit based on a metric difference between the best and longest paths visited with opposite decisions on that bit location.

22. The method defined in claim 20 wherein calculating a soft output value for each bit comprises computing a difference between a metric of the best visited full-length codeword and a metric of the longest alternative-decision on a given bit from that of the best visited full-length path.

23. The device defined in claim 20 wherein performing a first decoding operation further comprises using the soft output values from the inner SOMA-based MIMO detection process to produce output data, by use of a soft-output outer decoder and feeding soft values back to an inner decoder structure performing the first decoding operation for iterative decoding.

* * * * *